US006914990B2

(12) United States Patent
Abe

(10) Patent No.: US 6,914,990 B2
(45) Date of Patent: Jul. 5, 2005

(54) VOLUME ADJUSTING APPARATUS, METHOD AND COMPUTER PROGRAM PRODUCT

(75) Inventor: Ryoji Abe, Kanagawa-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 664 days.

(21) Appl. No.: 10/109,451

(22) Filed: Mar. 27, 2002

(65) Prior Publication Data

US 2002/0141604 A1 Oct. 3, 2002

(30) Foreign Application Priority Data

Mar. 30, 2001 (JP) ....................................... 2001-101107

(51) Int. Cl.[7] .................................................. H03G 3/00
(52) U.S. Cl. ....................................... 381/104; 381/107
(58) Field of Search ................................ 381/104, 107, 381/109, 106, 119; 700/94; 84/612, 622, 647, 659, 660

(56) References Cited

U.S. PATENT DOCUMENTS 4,461,025 A * 7/1984 Franklin ...................... 381/56
5,166,464 A * 11/1992 Sakata et al. ................. 84/662
5,280,129 A * 1/1994 Yamamori et al. ............ 84/656
5,596,651 A * 1/1997 Yamaguchi ................. 381/104
5,659,466 A * 8/1997 Norris et al. ................. 700/94
5,796,852 A * 8/1998 Yamaguchi ................. 381/104
5,978,492 A * 11/1999 Furuhashi .................... 381/119
6,298,139 B1 * 10/2001 Poulsen et al. ............. 381/107
6,314,330 B1 * 11/2001 Matthews ..................... 700/94
6,405,093 B1 * 6/2002 Malcolm et al. .............. 700/94
6,770,806 B2 * 8/2004 Okamura et al. ............. 84/609

* cited by examiner

*Primary Examiner*—Xu Mei
(74) *Attorney, Agent, or Firm*—Pearne & Gordon LLP

(57) ABSTRACT

Herein disclosed a volume adjusting apparatus comprising: a plurality of sound inputting terminals for respectively inputting sound elements; a plurality of volume setting means respectively connected with the sound inputting terminals to respectively set volume levels of the sound elements inputted by the sound inputting terminals; and a plurality of sound outputting terminals for respectively outputting the sound elements at the volume levels respectively set by the volume setting means; and volume setting number counting means for counting the number of the active volume setting means; and timer interval calculating means for calculating the time interval on the basis of the number of the active volume setting means calculated by the volume setting number counting means, thereby optimizing the time interval on the basis of the number of the active volume setting means to provides a sufficient response time calculated on the basis of the number of the active volume setting means so that the volume setting means can respectively set the volume levels of the sound elements in accordance with the volume envelope values respectively generated by the volume envelope generating means at the time interval indicated by the timer means.

33 Claims, 14 Drawing Sheets

FIG.6

| Volume envelope generating means | Flag data elements (example) | Flag search result | Setting values to be transmitted to volume setting means |
|---|---|---|---|
| #1 | (−40dB, 150ms, Attack) | O | Gain=−40dB |
| #2 | (−20dB, 70ms, Attack) | O | Gain=−20dB |
| #3 | None | × | None |
| #4 | (−10dB, 12ms, Release) | O | Gain=−10dB |
| #5 | None | × | None |
| #6 | (−3dB, 3ms, Attack) | O | Gain=−3dB |
| #7 | (−4dB, 5ms, Release) | O | Gain=−4dB |
| #8 | None | × | None |
| #9 | None | × | None |
| #10 | (−24dB, 120ms, Release) | O | Gain=−24dB |

VOLUME ADJUSTING APPARATUS, METHOD AND COMPUTER PROGRAM PRODUCT

BACKGROUND OF THE INVENTION

1. Field of the Invention

The present invention relates to volume adjusting apparatus, method and computer program product for inputting sounds from a plurality of inputting terminals to respectively set volume levels of the sounds thus inputted, and respectively outputting the sounds at the volume levels thus set, and more particularly to volume adjusting apparatus, method and computer program product for inputting sounds from a plurality of inputting terminals to respectively set volume levels of the sounds thus inputted at time intervals, and respectively outputting the sounds at the volume levels thus set at time intervals.

2. Description of the Related Art

Up until now, there have been proposed a wide variety of volume adjusting apparatus, each of which comprises a plurality of sound inputting terminals for respectively inputting sounds, a plurality of volume setting means respectively connected with the sound inputting terminals to respectively set volume levels of the sounds inputted by the sound inputting terminals, and a plurality of sound outputting terminals for respectively outputting the sounds at the volume levels respectively set by the volume setting means. Such volume adjusting apparatus can respectively input sounds from, for example, a plurality of sound sources, respectively set volume levels of sounds thus inputted and respectively output the sounds at the volume levels thus set to, for example, a plurality of speakers, not shown, placed in a theme park or in a place at the entertaining event. The volume adjusting apparatus of this type is gaining popularity more than before as a result of the increase in the number of the theme parks and entertaining events.

One typical example of the volume adjusting apparatus will be described hereinafter with reference to FIG. 14. The conventional volume adjusting apparatus 900 is shown in FIG. 14 as comprising: a plurality of sound inputting terminals 1—1 to 1-*n* for respectively inputting sound elements vin-1 to vin-n; a plurality of volume setting means 3-1 to 3-*n* respectively connected with the sound inputting terminals 1—1 to 1-*n* to respectively set volume levels of the sound elements vin-1 to vin-n inputted by the sound inputting terminals 1—1 to 1-*n*; and a plurality of sound outputting terminals 2-1 to 2-*n* for respectively outputting the sound elements vout-1 to vout-n at the volume levels respectively set by the volume setting means 3-1 to 3-*n*. The volume adjusting apparatus 900 further comprises: timer means 4 for outputting a trigger signal at a time interval; and a plurality of volume envelope generating means 5-1 to 5-*n* respectively corresponding to the volume setting means 3-1 to 3-*n* for selectively generating volume envelope values for respective volume setting means 3-1 to 3-*n* in accordance with predetermined envelope forms in response to the trigger signal outputted by the timer means 4 at the time interval. The volume setting means 3-1 to 3-*n* are operative to respectively set the volume levels of the sound elements vin-1 to vin-n inputted by the sound inputting terminals 1—1 to 1-*n* in accordance with the volume envelope values respectively generated by the volume envelope generating means 5-1 to 5-*n* in response to the trigger signal outputted by the timer means 4 at the time interval.

The conventional volume adjusting apparatus 900 thus constructed can control the volume levels of the inputted sound elements in accordance with the volume envelope values respectively generated by the volume envelope generating means 5-1 to 5-*n* in response to the trigger signal outputted by the timer means 4 at the time interval, thereby enabling to adjust and make sounds naturally audible by the human ear.

The conventional volume adjusting apparatus 900, however, encounters a problem that the conventional volume adjusting apparatus 900 cannot detect the state of each of the volume envelope generating means 5-1 to 5-*n*, i.e., whether any one of volume envelope values for the volume setting means 3-1 to 3-*n* respectively generated by the volume envelope generating means 5-1 to 5-*n* remains unchanged or not. This means that all of the volume envelope generating means 5-1 to 5-*n* are required to respectively set the volume setting means 3-1 to 3-*n* at a time interval indicated by the trigger signal outputted by the timer means 4 regardless whether any one of volume envelope values for the volume setting means 3-1 to 3-*n* respectively generated by the volume envelope generating means 5-1 to 5-*n* remains unchanged or not. This leads to the fact that the conventional volume adjusting apparatus 900 increases a time required to set the volume setting means 3-1 to 3-*n* as the number of the volume setting means 3-1 to 3-*n* increases, thereby aggravating the response time of the conventional volume adjusting apparatus 900. The response time of the conventional volume adjusting apparatus 900 may be further aggravated especially in the case that the volume setting means 3-1 to 3-*n* are manufactured as, for example, hardware units to be manually operated.

The conventional volume adjusting apparatus 900 encounters another problem that the volume setting means 3-1 to 3-*n* cannot respectively set the volume levels of the sound elements vin-1 to vin-n in accordance with the volume envelope values respectively generated by the volume envelope generating means 5-1 to 5-*n* at the time interval indicated by the timer means 4 if the response time is excessively aggravated as a result of the increase in the number of the volume setting means 3-1 to 3-*n*.

The present invention contemplates resolution of such problems.

SUMMARY OF THE INVENTION

It is therefore an object of the present invention to provide a volume adjusting apparatus in which not all of the volume envelope generating means are required to respectively set the volume setting means at a time interval indicated by the trigger signal outputted by the timer means if any one of volume envelope values for the volume setting means respectively generated by the volume envelope generating means remains unchanged, thereby improving the response time of the volume adjusting apparatus.

It is another object of the present invention to provide a volume adjusting apparatus which provides a sufficient response time calculated on the basis of the number of the volume setting means so that the volume setting means can respectively set the volume levels of the sound elements in accordance with the volume envelope values respectively generated by the volume envelope generating means at the time interval indicated by the timer means.

It is a further object of the present invention to provide a volume adjusting method in which not all of the volume envelope generating steps are required to respectively set the volume setting steps at a time interval indicated by the trigger signal outputted by the timer step if any one of volume envelope values for the volume setting steps respectively generated by the volume envelope generating steps remains unchanged, thereby improving the response time of the volume adjusting apparatus.

It is a still further object of the present invention to provide a volume adjusting method which provides a sufficient response time calculated on the basis of the number of the volume setting steps so that the volume setting steps can respectively set the volume levels of the sound elements in accordance with the volume envelope values respectively generated by the volume envelope generating steps at the time interval indicated by the timer step.

It is a yet further object of the present invention to provide a computer program product comprising a usable storage medium having computer readable code embodied therein for adjusting volumes recoded on a record medium, which improves the response time of the volume adjusting apparatus.

In accordance with a first aspect of the present invention, three is provided a volume adjusting apparatus comprising: a plurality of sound inputting terminals for respectively inputting sound elements; a plurality of volume setting means respectively connected with the sound inputting terminals to respectively set volume levels of the sound elements inputted by the sound inputting terminals; and a plurality of sound outputting terminals for respectively outputting the sound elements at the volume levels respectively set by the volume setting means; whereby the volume adjusting apparatus further comprises: timer means for outputting a trigger signal at a time interval; a plurality of volume envelope generating means respectively corresponding to the volume setting means for selectively generating volume envelope values for respective volume setting means in accordance with predetermined envelope forms in response to the trigger signal outputted by the timer means at the time interval; and control means for inputting volume envelope values for respective volume setting means respectively generated by the volume envelope generating means in response to the trigger signal outputted by the timer means at the time interval, selectively generating target flag data elements on the basis of differences of the volume envelope values for target volume setting means at the time interval for the volume envelope values changed at the time interval for the target volume setting means and generating non-target flag data elements for non-target volume setting means other than the target volume setting means at the time interval for the volume envelope values unchanged at the time interval for non-target volume setting means other than the target volume setting means, searching the target flag data elements from among the flag data elements thus generated to determine target volume setting means respectively corresponding to target volume envelope generating means which respectively generated volume envelope values changed at the time interval for the target volume setting means, and respectively outputting the target flag data elements to the target volume setting means in response to the trigger signal outputted by the timer means at the time interval; the target volume setting means are operative to respectively set the volume levels of target sound elements inputted by target sound inputting terminals in accordance with the target flag data elements outputted by the control means.

The aforesaid volume adjusting apparatus may further comprise: flag number counting means for counting the number of target volume setting means which the control means is operative to output the target flag data elements to; and timer interval calculating means for calculating the time interval on the basis of the number of target volume setting means thus calculated by the flag number counting means. The timer means may be operative to output the trigger signal at the time interval calculated by the timer interval calculating means.

In accordance with a second aspect of the present invention, there is provided volume adjusting method comprising the steps of: a plurality of sound inputting steps (1—1 to 1-*n*) of respectively inputting sound elements; a plurality of volume setting steps (3-1 to 3-*n*) respectively connected with the sound inputting steps (1—1 to 1-*n*) of respectively setting volume levels of the sound elements inputted in the sound inputting steps (1—1 to 1-*n*); and a plurality of sound outputting steps (2-1 to 2-*n*) of respectively outputting the sound elements at the volume levels respectively set in the volume setting steps (3-1 to 3-*n*); whereby the volume adjusting method further comprises the steps of: timer step (4) of outputting a trigger signal at a time interval; a plurality of volume envelope generating steps (5-1 to 5-*n*) respectively corresponding to the volume setting steps (3-1 to 3-*n*) of selectively generating volume envelope values for respective volume setting steps (3-1 to 3-*n*) in accordance with predetermined envelope forms in response to the trigger signal outputted in the timer step (4) at the time interval; and control step (6, 7) of inputting volume envelope values for respective volume setting steps (3-1 to 3-*n*) respectively generated in the volume envelope generating steps (5-1 to 5-*n*) in response to the trigger signal outputted in the timer step (4) at the time interval, selectively generating target flag data elements on the basis of differences of the volume envelope values for target volume setting steps (3-*i* to 3-*j*) at the time interval for the volume envelope values changed at the time interval for the target volume setting steps (3-*i* to 3-*j*) and generating non-target flag data elements for non-target volume setting steps (3-1 to 3-*n*) other than the target volume setting steps (3-*i* to 3-*j*) at the time interval for the volume envelope values unchanged at the time interval for non-target volume setting steps (3-1 to 3-*n*) other than the target volume setting steps (3-*i* to 3-*j*), searching the target flag data elements from among the flag data elements thus generated to determine target volume setting steps (3-*i* to 3-*j*) respectively corresponding to target volume envelope generating steps (5-*i* to 5-*j*) which respectively generated volume envelope values changed at the time interval for the target volume setting steps (3-*i* to 3-*j*), and respectively outputting the target flag data elements to the target volume setting steps (3-*i* to 3-*j*) in response to the trigger signal outputted in the timer step (4) at the time interval; the target volume setting steps (3-*i* to 3-*j*) have the steps of respectively setting the volume levels of target sound elements inputted by target sound inputting steps (1-*i* to 1-*j*) in accordance with the target flag data elements outputted in the control step (6, 7).

The aforesaid volume adjusting method (300) may further comprises the steps of: flag number counting step (10) of counting the number of target volume setting steps (3-*i* to 3-*j*) which the control step (6, 7) has the step of outputting the target flag data elements to; and timer interval calculating step (9) of calculating the time interval on the basis of the number of target volume setting steps (3-*i* to 3-*j*) thus calculated in the flag number counting step (10), the timer step (4) has the step of outputting the trigger signal at the time interval calculated in the timer interval calculating step (9).

In accordance with a third aspect of the present invention, three is provided a computer program product comprising a computer usable storage medium having computer readable code embodied therein for adjusting volumes recoded on a record medium, wherein the computer readable code comprising: a plurality of program product codes (1—1 to 1-*n*) for respectively inputting sound elements; a plurality of program product codes (3-1 to 3-*n*) respectively connected with the program product codes (1—1 to 1-*n*) to respectively set volume levels of the sound elements inputted by the program product codes (1—1 to 1-*n*); and a plurality of program product codes (2-1 to 2-*n*) for respectively outputting the sound elements at the volume levels respectively set by the program product codes (3-1 to 3-*n*); whereby the computer program product further comprises: program product code (4) for outputting a trigger signal at a time interval; a plurality of program product codes (5-1 to 5-*n*) respectively corresponding to the program product codes (3-1 to 3-*n*) for selectively generating volume envelope values for respective program product codes (3-1 to 3-*n*) in accordance with predetermined envelope forms in response to the trigger signal outputted by the program product code (4) at the time interval; and program product code (6, 7) for inputting volume envelope values for respective program product codes (3-1 to 3-*n*) respectively generated by the program product codes (5-1 to 5-*n*) in response to the trigger signal outputted by the program product code (4) at the time interval, selectively generating target flag data elements on the basis of differences of the volume envelope values for target program product codes (3-*i* to 3-*j*) at the time interval for the volume envelope values changed at the time interval for the target program product codes (3-*i* to 3-*j*) and generating non-target flag data elements for non-target program product codes (3-1 to 3-*n*) other than the target program product codes (3-*i* to 3-*j*) at the time interval for the volume envelope values unchanged at the time interval for non-target program product codes (3-1 to 3-*n*) other than the target program product codes (3-*i* to 3-*j*), searching the target flag data elements from among the flag data elements thus generated to determine target program product codes (3-*i* to 3-*j*) respectively corresponding to target program product codes (5-*i* to 5-*j*) which respectively generated volume envelope values changed at the time interval for the target program product codes (3-*i* to 3-*j*), and respectively outputting the target flag data elements to the target program product codes (3-*i* to 3-*j*) in response to the trigger signal outputted by the program product code (4) at the time interval; and the target program product codes (3-*i* to 3-*j*) have computer product code for respectively setting the volume levels of target sound elements inputted by target program product codes (1-*i* to 1-*j*) in accordance with the target flag data elements outputted by the program product code (6, 7).

The aforesaid computer program product may further comprise: program product codes (11-1 to 11-*n*) respectively corresponding to the program product codes (5-1 to 5-*n*) each for inputting a trigger operation command therethrough and outputting a trigger signal to corresponding one of the program product codes (5-1 to 5-*n*) in accordance with the trigger operation command, in which one or more of the program product codes (11-*a* to 11-*b*) are operated to input the trigger operation commands and output trigger signals to corresponding one or more of the program product codes (5-*a* to 5-*b*) in accordance with the trigger operation commands, and the one or more of the program product codes (5-*a* to 5-*b*) respectively corresponding to one or more of the program product codes (11-*a* to 11-*b*) have computer product code for selectively generating volume envelope values for respective program product codes (3-*a* to 3-*b*) in accordance with predetermined envelope forms in response to the trigger signals outputted by one or more of the program product codes (11-*a* to 11-*b*).

BRIEF DESCRIPTION OF THE DRAWINGS

The features and advantages of the volume adjusting apparatus according to the present invention will more clearly be understood from the following description taken in conjunction with the accompanying drawings in which:

FIG. 6 is a table showing examples of flag data elements generated at time t=T in the volume adjusting apparatus 100 shown in FIG. 1;

DESCRIPTION OF THE PREFERRED EMBODIMENTS

Figure 1:
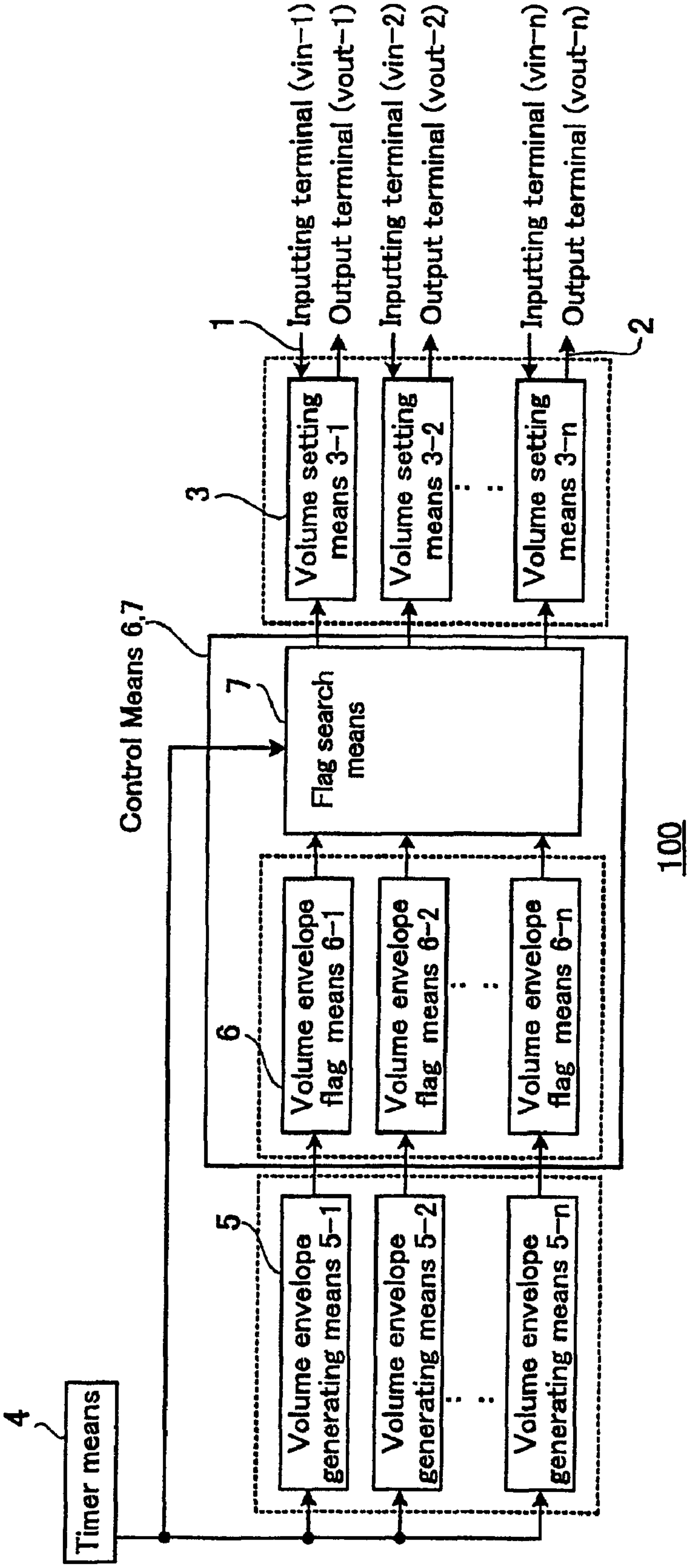
FIG. 1 is a block diagram showing a first embodiment of the volume adjusting apparatus 100 according to the present invention.

Throughout the following detailed description, similar reference characters and numbers refer to similar elements in all figures of the drawings.

Referring now to FIGS. 1 through 6 of the drawings, there is shown a first preferred embodiment of the volume adjusting apparatus 100 according to the present invention. The first embodiment of the volume adjusting apparatus 100 is shown in FIG. 1 as comprising a plurality of sound inputting terminals 1—1 to 1-*n*, a plurality of volume setting means 3-1 to 3-*n* respectively connected with the sound inputting terminals 1—1 to 1-*n*, and a plurality of sound outputting terminals 2-1 to 2-*n*.

The sound inputting terminals 1—1 to 1-*n* are adapted to respectively input sound elements vin-1 to vin-n from, for example, a plurality of sound sources, not shown. The volume setting means 3-1 to **3-*n* are respectively connected with the sound inputting terminals 1—1 to 1-*n* to respectively set volume levels of the sound elements vin-1 to vin-n inputted by the sound inputting terminals 1—1 to 1-*n*. The sound outputting terminals 2-1 to 2-*n* are adapted to respectively output the sound elements vout-1 to vout-n at the volume levels respectively set by the volume setting means 3-1 to 3-*n***, to, for example but not limited to, a plurality of speakers, not shown.

The volume setting means 3-1 to **3-*n* may be controlled manually by an operator. This means that the volume setting means 3-1 to 3-*n* may respectively set volume levels of the sound elements vin-1 to vin-n inputted by the sound inputting terminals 1—1 to 1-*n* in accordance with, for example, an operation by an operator. The volume setting means 3-1 to 3-*n***, on the other hand, may be controlled automatically in accordance with time in the manner as will be described hereinlater.

The volume adjusting apparatus 100 further comprises timer means 4, a plurality of volume envelope generating means 5-1 to **5-*n*, and control means 6, 7**.

The timer means 4 is adapted to output a trigger signal at a time interval. The volume envelope generating means 5-1 to **5-*n* are respectively corresponding to the volume setting means 3-1 to 3-*n* and adapted to selectively generate volume envelope values for respective volume setting means 3-1 to 3-*n* in accordance with predetermined envelope forms in response to the trigger signal outputted by the timer means 4 at the time interval viz., at a time indicated by the trigger signal outputted by the timer means 4 at time interval. The control means 6, 7 is adapted to input volume envelope values for respective volume setting means 3-1 to 3-*n* respectively generated by the volume envelope generating means 5-1 to 5-*n* in response to the trigger signal outputted by the timer means 4 at the time interval, selectively generate target flag data elements on the basis of differences of the volume envelope values for target volume setting means 3-*i* to 3-*j* at the time interval for the volume envelope values changed at the time interval for the target volume setting means 3-*i* to 3-*j* and generate non-target flag data elements for non-target volume setting means 3-*k* to 3*l* other than the target volume setting means 3-*i* to 3-*j* at the time interval for the volume envelope values unchanged at the time interval for non-target volume setting means 3-*k* to 3-*l* other than the target volume setting means 3-*i* to 3-*j*, search the target flag data elements from among the flag data elements thus generated to determine target volume setting means 3-*i* to 3-*j* respectively corresponding to the target volume envelope generating means 5-*i* to 5-*j* which respectively generated volume envelope values changed at the time interval for the target volume setting means 3-*i* to 3-*j*, and respectively output the target flag data elements to the target volume setting means 3-*i* to 3-*j* in response to the trigger signal outputted by the timer means 4 at the time interval. Here, the target volume setting means 3-*i* to 3-*j* are intended to mean volume setting means 3-*i* to 3-*j* for which the volume envelope values chanted at the time interval. Target volume envelope generating means 5-*i* to 5-*j* are intended to mean volume envelope generating means 5-*i* to 5-*j*** which respectively generated volume envelope values changed at the time interval.

The target volume setting means **3-*i* to 3-*j* are adapted to respectively set the volume levels of the target sound elements v-i to v-j inputted by the target sound inputting terminals 1-*i* to 1-*j* in accordance with the target flag data elements outputted by the control means 6, 7**.

More specifically, the control means 6, 7 includes a plurality of volume envelope flag means 6-1 to **6-*n*, and flag search means 7 as shown in FIG. 1**.

The volume envelope flag means 6-1 to **6-*n* respectively corresponds to the volume envelope generating means 3-1 to 3-*n*. The volume envelope flag means 6-1 to 6-*n* are adapted to input volume envelope values for respective volume setting means 3-1 to 3-*n* generated by the volume envelope generating means 5-1 to 5-*n* at the time interval, and selectively generate target flag data elements on the basis of differences of the volume envelope values for target volume setting means 3-*i* to 3-*j* at the time interval for the volume envelope values changed at the time interval for the target volume setting means 3-*i* to 3-*j* and generate non-target flag data elements for non-target volume setting means 3-*k* to 3-*l* other than the target volume setting means 3-*i* to 3-*j* at the time interval for the volume envelope values unchanged at the time interval for non-target volume setting means 3-*k* to 3*l* other than the target volume setting means 3-*i* to 3-*j*. The flag search means 7 is adapted to search the target flag data elements from among the flag data elements thus generated by the volume envelope flag means 6-1 to 6-*n* to determine target volume setting means 3-*i* to 3-*j* respectively corresponding to the target volume envelope generating means 5-*i* to 5-*j* which respectively generated volume envelope values changed at the time interval for the target volume setting means 3-*i* to 3-*j*, and respectively output the target flag data elements to the target volume setting means 3-*i* to 3-*j* in response to the trigger signal outputted by the timer means 4 at the time interval. Here, the target volume envelope flag means 6-*i* to 6-*j* are intended to mean volume envelope flag means 6-*i* to 6-*j* which respectively generated the target flag data elements, and the target volume setting means 3-*i* to 3-*j* are intended to mean volume setting means 3-*i* to 3-*j* respectively corresponding to the target volume envelope flag means 6-*i* to 6-*j*. Target volume envelope generating means 5-*i* to 5-*j* are intended to mean volume envelope generating means 5-*i* to 5-*j*** which respectively generated volume envelope values changed at the time interval.

The operation of the volume adjusting apparatus 100 will be described hereinlater.

The sound inputting terminals 1—1 to **1-*n* are operated to respectively input sound elements vin-1 to vin-n, from, for example, a plurality of sound sources. The timer means 4 is operated to output a trigger signal at a time interval. The volume envelope generating means 5-1 to 5-*n* are operated to selectively generate volume envelope values for respective volume setting means 3-1 to 3-*n* in accordance with predetermined envelope forms in response to the trigger signal outputted by the timer means 4** at the time interval.

Figure 2:
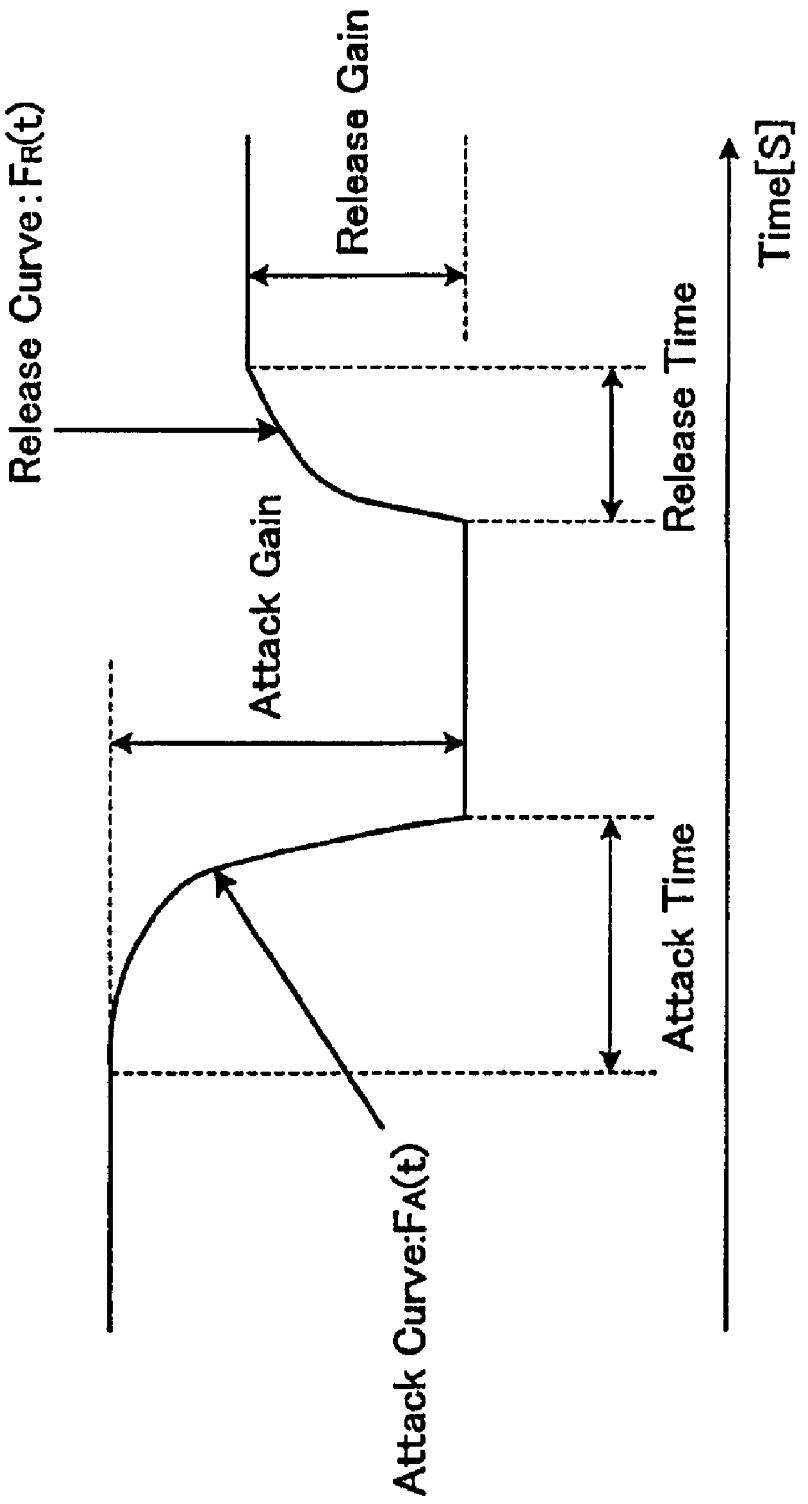
FIG. 2 is a graph showing volume envelopes generated by volume envelope generating means 5 in the volume adjusting apparatus 100 shown in FIG. 1.

The volume envelope values generated by the volume envelope generating means 5 collectively form volume envelopes as best shown in FIG. 2. It is to be noted that the volume envelope generating means 5 refers to any one of the volume envelope generating means 5-1 to **5-*n***.

The description hereinlater will be directed to the operation of the volume envelope generating means 5.

As shown in FIG. 2, the volume envelope generating means 5 is operated to generate volume envelopes in response to trigger signals outputted by the timer means 4 at time intervals. "Attack Gain" is intended to mean a target volume level to which the volume envelope values are supposed to converge. This means that the volume envelope generating means 5 is operated to generate a volume envelope indicated by "Attack Curve $F_A(t)$" in response to the trigger signals outputted by the timer means 4 until the volume envelope converges to "Attack Gain" during the time period of "Attack Time". The volume envelope generating means 5 is later operated to generate a volume envelope indicated by "Release Curve $F_R(t)$" in response to trigger signals outputted by the timer means 4 until the volume envelope converges to "Release Gain" during the time period of "Release Time". After the volume envelope converges to a specified value such as "Attack Gain" and "Release Gain", the volume envelope generating means 5 is operated generate the same values, i.e., flat values for respective volume setting means 3 until another volume envelope such as "Attack Curve" and "Release Curve" is to be generated.

The volume envelope generating means 5 stores pattern data elements including major values and major times required to determine volume envelopes in accordance with time. The major values include, for example but not limited to, "Attack Gain" data elements, "Attack Time" data elements, "Release Gain" data elements, and "Release Time" data elements and major times include, for example but not limited to, "Attack Time" start time data elements at which "Attack Time" starts and "Release Time" start time data elements at which "Release Time" starts. The aforesaid pattern data elements stored in the volume envelope generating means 5 make it possible for the volume envelope generating means 5 to start to selectively generate a volume envelope value for the volume setting means 3 in accordance with a predetermined envelope form determined by the aforesaid major values at a point in accordance with the time indicated by the trigger signal outputted by the timer means 4.

The volume envelope generating means S may start to selectively generate a volume envelope value for the volume setting means 3 in accordance with a predetermined envelope form of, for example, "Attack Curve" determined by the aforesaid major values and aforesaid major times at a point of, for example, "Attack Curve $F_A(t)$" in response to the trigger signal outputted by the timer means 4 at time interval of $T_1$, viz., at a time indicated by the trigger signal outputted by the timer means 4 at time interval of, for example, $T_1$.

Furthermore, the volume envelope generating means 5 is then operated to selectively generate volume envelope values for the volume setting means 3 in accordance with a predetermined envelope form of "Attack Curve" at a point of "Attack Curve $F_A(t+T_1)$" in response to the trigger signal outputted by the timer means 4 at time interval of $T_1$.

The control means 6, 7 is then operated to input the volume envelope values for volume setting means 3 at points of "Attack Curve $F_A(t)$" and "Attack Curve $F_A(t+T_1)$" generated by the volume envelope generating means 5 in response to the trigger signal outputted by the timer means 4 at the time interval of $T_1$ viz. at a time indicated by the trigger signal outputted by the timer means 4, selectively generate target flag data elements on the basis of differences of the volume envelope values "Attack Curve $F_A(t)$" and "Attack Curve FA($t+T_1$)" for target volume setting means 3 at the time interval of $T_1$ for the volume envelope values of "Attack Curve $F_A(t)$" and "Attack Curve $F_A(t+T_1)$" changed at the time interval of $T_1$ for the target volume setting means 3 and generate non-target flag data elements for non-target volume setting means 3-*k* to 3-*l* other than the target volume setting means 3-*i* to 3-*j* at the time interval of $T_1$ for the volume envelope values unchanged at the time interval of $T_1$ for non-target volume setting means 3-*k* to 3-*l* other than the target volume setting means 3-*i* to 3-*j*, search the target flag data elements from among the flag data elements thus generated to determine target volume setting means 3-*i* to 3-*j* respectively corresponding to the target volume envelope generating means 5-*i* to 5-*j* which respectively generated volume envelope values changed at the time interval of $T_1$ for the target volume setting means 3-*i* to 3-*j*, and respectively output the target flag data elements to the target volume setting means 3-*i* to 3-*j* in response to the trigger signal outputted by the timer means 4 at the time interval of $T_1$, viz. at a time indicated by the trigger signal outputted by the timer means 4 of $T_1$.

More specifically, the control means 6, 7 is constituted by the volume envelope flag means 6 and the flag search means 7. It is to be noted that the volume envelope flag means 6 refers to any one of the volume envelope flag means 6-1 to 6-*n*, which corresponds to the volume envelope generating means 5, volume setting means 6 refers to one of the volume setting means 6-1 to 6-*n*, which corresponds to the volume envelope generating means 5.

The volume envelope flag means 6 is operated to input volume envelope values of "Attack Curve $F_A(t)$" and "Attack Curve $F_A(t+T_1)$" for the volume setting means 3 generated by the volume envelope generating means 5 at time interval of $T_1$, selectively generate target flag data elements on the basis of differences of the volume envelope values "Attack Curve $F_A(t)$" and "Attack Curve $F_A(t+T_1)$" for target volume setting means 3 at the time interval of $T_1$ for the volume envelope values of "Attack Curve $F_A(t)$" and "Attack Curve $F_A(t+T_1)$" changed at the time interval of $T_1$ for the target volume setting means 3 and generate non-target flag data elements for non-target volume setting means 3-*k* to 3-*l* other than the target volume setting means 3-*i* to 3-*j* at the time interval of $T_1$ for the volume envelope values unchanged at the time interval of $T_1$ for non-target volume setting means 3-*k* to 3-*l* other than the target volume setting means 3-*i* to 3-*j*. The flag search means 7 is operated to search the target flag data elements from among the flag data elements generated by the volume envelope flag means 6 to determine target volume setting means 3-*i* to 3-*j* respectively corresponding to the target volume envelope generating means 5-*i* to 5-*j* which respectively generated volume envelope values changed at the time interval of $T_1$ for the target volume setting means 3-*i* to 3-*j*, and respectively output the target flag data elements to the target volume setting means 3-*i* to 3-*j* in response to the trigger signal outputted by the timer means 4 at the time interval of $T_1$, viz. at a time indicated by the trigger signal outputted by the timer means 4 of $T_1$. This means that the control means 6, 7 is operated to search the target volume setting means 3-*i* to 3-*j* on the basis of the target flag data elements at time interval of $T_1$ viz. at a time indicated by the trigger signal outputted by the timer means 4 of $T_1$.

The target volume setting means 3-*i* to 3-*j* are operated to respectively set the volume levels of the sound elements inputted by the target sound inputting terminals 1-*i* to 1-*j* in accordance with the target flag data elements outputted by the control means 6, 7. This means that the volume setting means other than the target volume setting means 3-*i* to 3-*j* are not operated to set the volume levels of the sound elements inputted by the respective sound inputting terminals in accordance with the target flag data elements outputted by the control means 6, 7.

From the foregoing description, it is to be understood that the first embodiment of the volume adjusting apparatus 100 according to the present invention, comprising the control means 6, 7 operative to input volume envelope values for respective volume setting means 3-1 to 3-*n* respectively generated by the volume envelope generating means 5-1 to 5-*n* in response to the trigger signal outputted by the timer means 4 at the time interval, selectively generate flag data elements on the basis of differences of the volume envelope values for respective volume setting means 3-1 to 3-*n* at the time interval for the volume envelope values changed at the time interval, selectively generate target flag data elements on the basis of differences of the volume envelope values for target volume setting means 3-*i* to 3-*j* at the time interval for the volume envelope values changed at the time interval for the target volume setting means 3-*i* to 3-*j* and generate non-target flag data elements for non-target volume setting means 3-*k* to 3-*l* other than the target volume setting means 3-*i* to 3-*j* at the time interval for the volume envelope values unchanged at the time interval for non-target volume setting means 3-*k* to 3*l* other than the target volume setting means 3-*i* to 3-*j*, search the target flag data elements from among the flag data elements thus generated to determine target volume setting means 3-*i* to 3-*j* respectively corresponding to the target volume envelope generating means 5-*i* to 5-*j* which respectively generated volume envelope values changed at the time interval for the target volume setting means 3-*i* to 3-*j*, and respectively output the target flag data elements to the target volume setting means 3-*i* to 3-*j* in response to the trigger signal outputted by the timer means 4 at the time interval, makes it possible that not all of the volume envelope generating means 5-1 to 5-*n* are required to respectively set the volume setting means 3-1 to 3-*n* at a time interval indicated by the trigger signal outputted by the timer means 4 if any one of volume envelope values for the volume setting means 3-1 to 3-*n* respectively generated by the volume envelope generating means 5-1 to 5-*n* remains unchanged, thereby improving the response time of the volume adjusting apparatus 100.

Furthermore, the volume adjusting apparatus 100 comprises n units of volume envelope generating means 5-1 to 5-*n* and n units of volume envelope flag means 6-1 to 6-*n*. The operations of each of the volume envelope generating means 5-1 to 5-*n* and each of the volume envelope flag means 6-1 to 6-*n* are the same as those of the volume envelope generating means 5 and the volume envelope flag means 6, which have been described in the above.

The volume envelope generating means 5-1 to 5-*n* are operated to selectively generate volume envelope values for respective volume setting means 3-1 to 3-*n* in accordance with predetermined envelope forms in response to the trigger signal outputted by the timer means 4 at the time interval. The volume envelope generating means 5-1 to 5-*n* may start to selectively generate volume envelope values for respective volume setting means 3-1 to 3-*n* in accordance with predetermined envelope forms at respective points simultaneously in response to the trigger signal outputted by the timer means 4 at the time interval. This means that the volume envelope generating means 5-1 may start to selectively generate a volume envelope value for the volume setting means 3 in accordance with a predetermined envelope form determined by the aforesaid major values at a point of, for example, "Attack Curve $F_A(t)$" in response to the trigger signal outputted by the timer means 4 at time interval of $T_1$, viz. at a time indicated by the trigger signal outputted by the timer means 4 of $T_1$ while the volume envelope generating means 5-2, on the other hand, may start to selectively generate a volume envelope value for the volume setting means 3 in accordance with a predetermined envelope form determined by the aforesaid major values at a point of, for example, "Release Curve $F_R(t)$" at the same time indicated by the trigger signal outputted by the timer means 4 of $T_1$.

Figure 3:
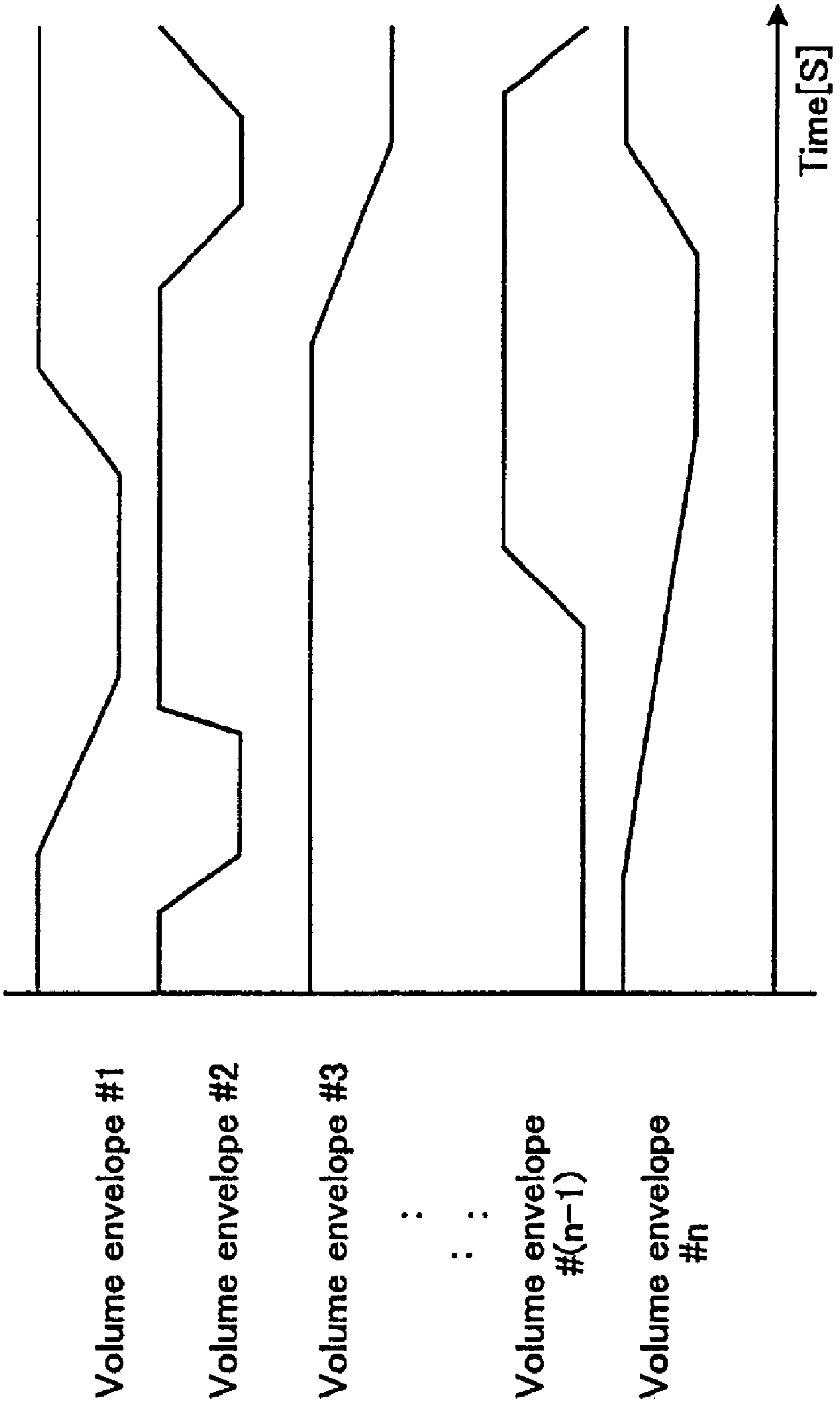
FIG. 3 is a graph showing volume envelopes generated by volume envelope generating means 5-1 to 5-*n* in the volume adjusting apparatus 100 shown in FIG. 1.

Examples of volume envelopes generated by volume envelope generating means 5-1 to 5-*n* in the volume adjusting apparatus 100 are shown in FIG. 3. Volume envelopes #1, #2, #3, . . . #(n-1), #n respectively refer to volume envelopes generated by volume envelope generating means 5-1, 5-2, 5-3, . . . , 5-(*n*-1), 5-*n* in the volume adjusting apparatus 100. As best shown in FIG. 3, the volume envelope generating means 5-1 to 5-*n* start to selectively generate volume envelope values for respective volume setting means 3-1 to 3-*n* in accordance with predetermined envelope forms such as "Attack Curve" and "Release Curve" at respective points simultaneously in response to the trigger signal outputted by the timer means 4 at the time interval.

Figure 4:
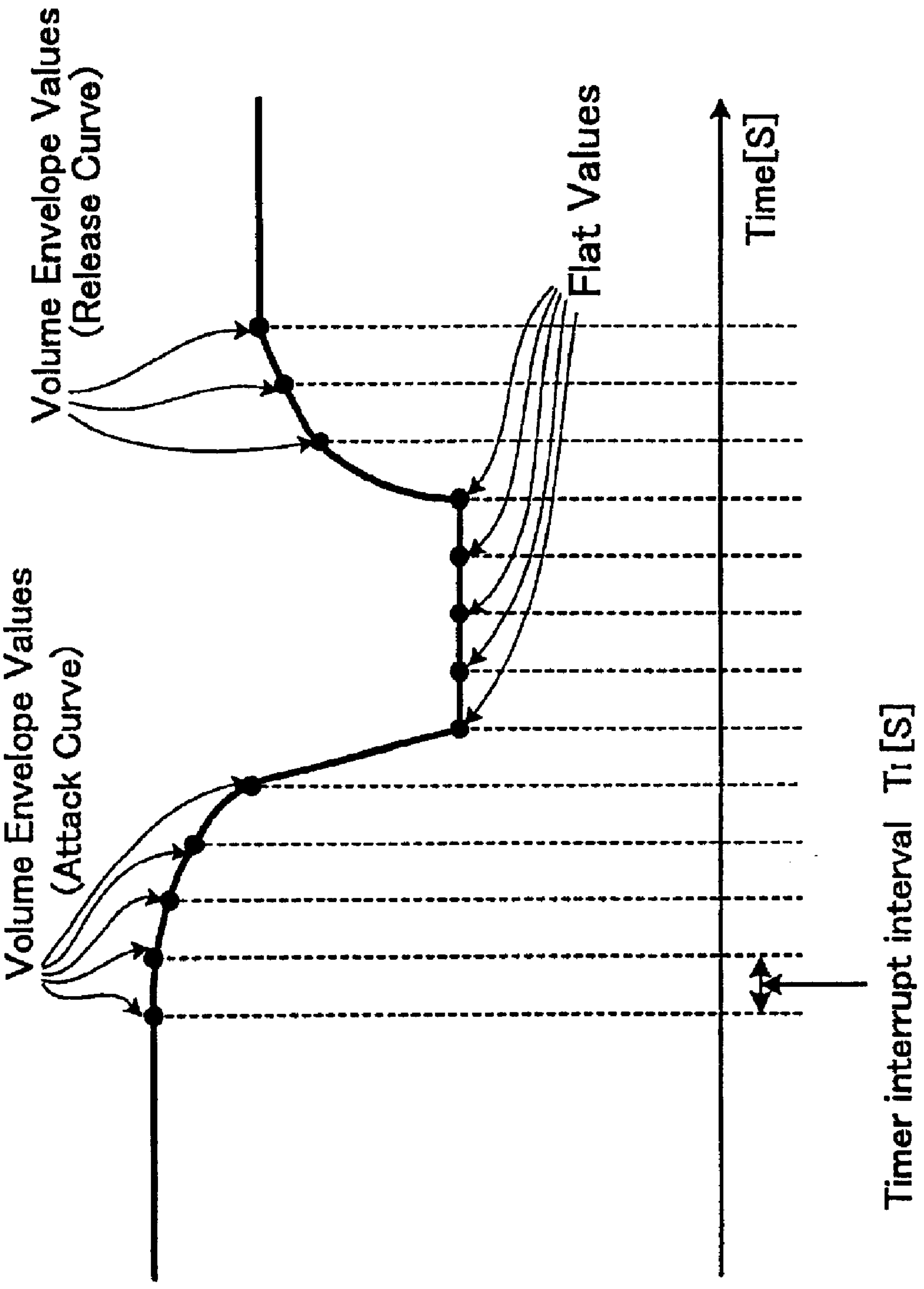
FIG. 4 is a graph showing volume envelope values generated at time intervals of $T_1$ indicated by timer means 4 by volume envelope generating means 5 in the volume adjusting apparatus 100 shown in FIG. 1.

Examples of volume envelope values generated at a time interval of $T_1$ indicated by timer means 4 by volume envelope generating means 5 in the volume adjusting apparatus 100 are shown in FIG. 4. As best shown in FIG. 4, the volume envelope generating means S generates volume envelope values for respective volume setting means 3 in accordance with predetermined envelope forms such as "Attack Curve" and "Release Curve" and does not generate volume envelope values for corresponding volume setting means 3 in accordance with predetermined envelope forms such as "Attack Curve" and "Release Curve", but generate flat values at respective points in response to the trigger signals outputted by the timer means 4 at timer interrupt intervals, i.e., time intervals of $T_1$.

Figure 5:
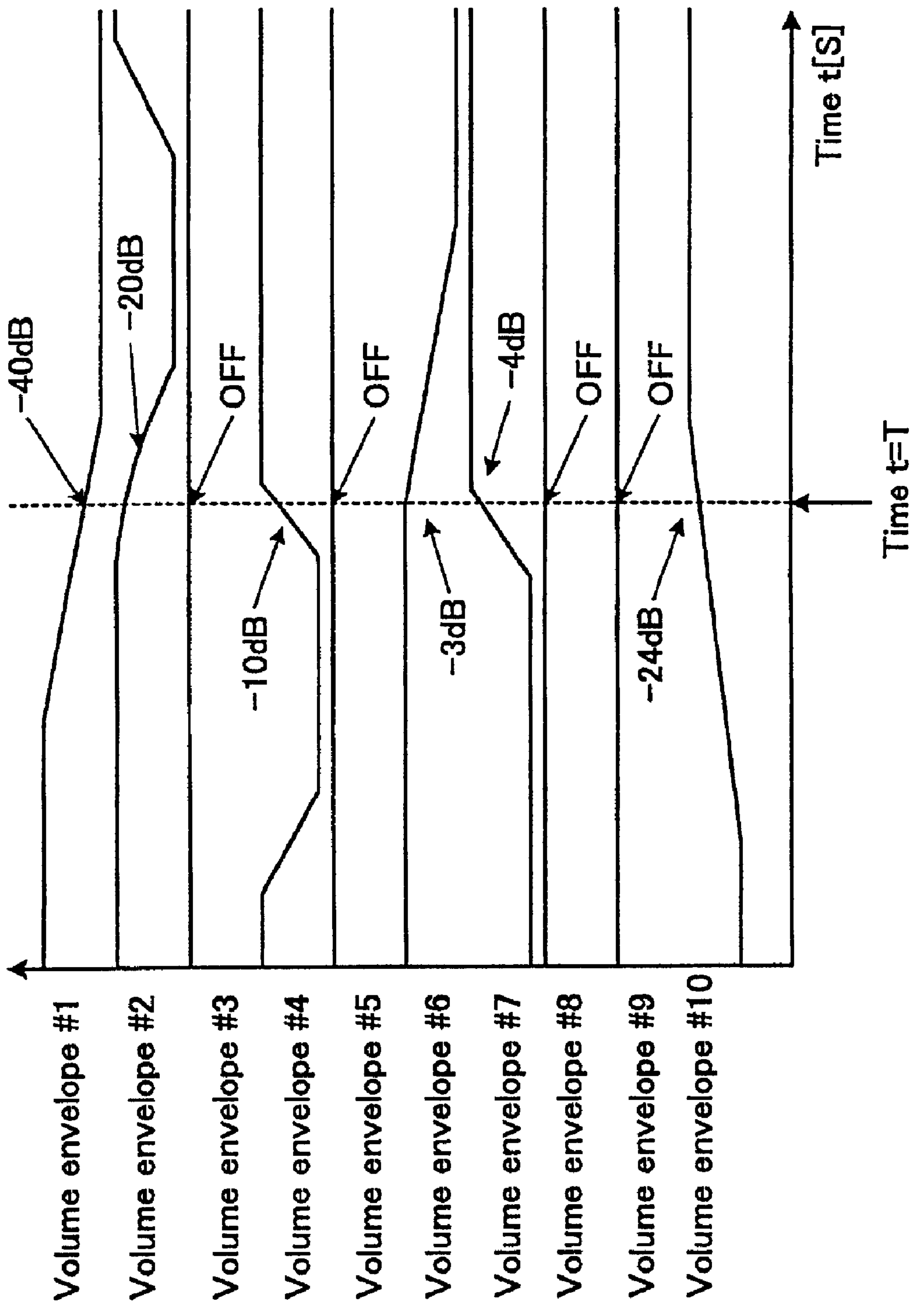
FIG. 5 is a graph showing volume envelopes generated by 10 units of volume envelope generating means 5-1 to 5-10 in the volume adjusting apparatus 100 shown in FIG. 1.

Examples of volume envelopes generated by 10 units of volume envelope generating means 5-1 to 5-10 are shown in FIG. 5. As shown in FIG. 5, the values generated by the volume envelope generating means 5-1 to 5-10 change in accordance with the envelope forms and remain unchanged in response to the trigger signals outputted by the timer means 4 at the time interval.

Examples of flag data elements generated by the volume envelope flag means 6-1 to 6-10 in the control means 6, 7 at time t=T are listed in a table shown in FIG. 6. As described in the above, the control means 6, 7 is operative to selectively generate target flag data elements on the basis of differences of the volume envelope values for target volume setting means 3-1, 3-2, 3-4, 3-6, 3-7, and 3-10 at the time interval for the volume envelope values changed at the time interval for the target volume setting means 3-1, 3-2, 3-4, 3-6, 3-7, and 3-10 and generate non-target flag data elements for non-target volume setting means 3-3, 3-5, 3-8, and 3-9 other than the target volume setting means 3-1, 3-2, 3-4, 3-6, 3-7, and 3-10 at the time interval for the volume envelope values unchanged at the time interval for non-target volume setting means 3-3, 3-5, 3-8, and 3-9 other than the target volume setting means 3-1, 3-2, 3-4, 3-6, 3-7, and 3-10. This means that the flag data elements include target flag data elements and non-target flag data elements. The target flag data elements are generated on the basis of differences of the volume envelope values for target volume setting means 3-1, 3-2, 34, 3-6, 3-7, and 3-10 at the time interval for the volume envelope values changed at the time interval. As best shown in FIG. 6, the target flag data elements may include, for example but not limited to, gain values such as "−40 dB", "−20 dB", and "−10 dB" to which the volume envelope values converge, times such as "150 ms", "70 ms", and "12 ms" at which the volume envelope values start, and identifiers of the volume envelope such as "Attack" and "release". This means that the target flag data elements may include, for example, a part of, or all of volume envelope values generated at the time interval. Non-target flag data elements are generated for non-target volume setting means 3-3, 3-5, 3-8, and 3-9 other than the target volume setting means 3-1,

3-2, 34, 3-6, 3-7, and 3-10 at the time interval for the volume envelope values unchanged at the time interval for non-target volume setting means 3-3, 3-5, 3-8, and 3-9 other than the target volume setting means 3-1, 3-2, 3-4, 3-6, 3-7, and 3-10. The volume envelope values unchanged at the time interval are flat values also shown in FIG. 4. The volume envelope flag means 6 may generate no flag data elements as non-target flag data elements or non-target volume setting means 3-*k* to 3*l* other than the target volume setting means 3-*i* to 3-*j* at the time interval of $T_1$ for the volume envelope values unchanged at the time interval of $T_1$ for non-target volume setting means 3-*k* to 3-*l* other than the target volume setting means 3-*i* to 3-*j*. This means that non-target flag data elements may include, for example, "none" as shown in FIG. 6.

In the case of the flag data elements shown in FIG. 6, the flag search means 7 is operated to search the target flag data elements from among 10 flag data elements generated by the volume envelope flag means 6-1 to 6-10 to determine target volume setting means 3-1, 3-2, 3-4, 3-6, 3-7, and 3-10 respectively corresponding to the target volume envelope generating means 5-1, 5-2, 54, 5-6, 5-7, and 5-10 which respectively generated volume envelope values changed at the time interval of $T_1$ for the target volume setting means 3-1, 3-2, 3-4, 3-6, 3-7, and 3-10, and respectively output the target flag data elements to 6 units of the target volume setting means 3-1, 3-2, 3-4, 3-6, 3-7, and 3-10 in response to the trigger signal outputted by the timer means 4 at the time interval of $T_1$, viz. at a time indicated by the trigger signal outputted by the timer means 4 of $T_1$. 6 units of the target volume setting means 3-1, 3-2, 3-4, 3-6, 3-7, and 3-10 are operated to set the volume levels of the sound elements inputted by the sound inputting terminals 1—1, 1-2, 14, 1-6, 1-7, and 1—1 0 in accordance with the target flag data elements outputted by the control means 6, 7. This means that 4 units of the non-target volume setting means 3-3, 3-5, 3-8, and 3-9 other than the target volume setting means 3-1, 3-2, 3-4, 3-6, 3-7, and 3-10 are not operated to set the volume levels of the sound elements inputted by the respective sound inputting terminals and the control means 6, 7 is operated to search the non-target volume setting means 3-3, 3-5, 3-8, and 3-9 on the basis of the non-target flag data elements at time interval of $T_1$. The control means 6, 7 is thus operated to optimize the number of the target volume setting means 3-*i* to 3-*j* which are operated to selectively set the volume levels of the target sound elements inputted by the target sound inputting terminals 1-*i* to 1-*j* in accordance with the target flag data elements outputted by the control means 6, 7 at the time interval of $T_1$, thereby improving the response time of the volume adjusting apparatus 100.

In the first embodiment of the volume adjusting apparatus 100 thus constructed, not all of the volume envelope generating means 5-1 to 5-*n* are required to respectively set the volume setting means 3-1 to 3-*n* at a time interval indicated by the trigger signal outputted by the timer means 4 if any one of volume envelope values for the volume setting means 3-1 to 3-*n* respectively generated by the volume envelope generating means 5-1 to 5-*n* remains unchanged, thereby improving the response time of the volume adjusting apparatus 100.

Figure 7:
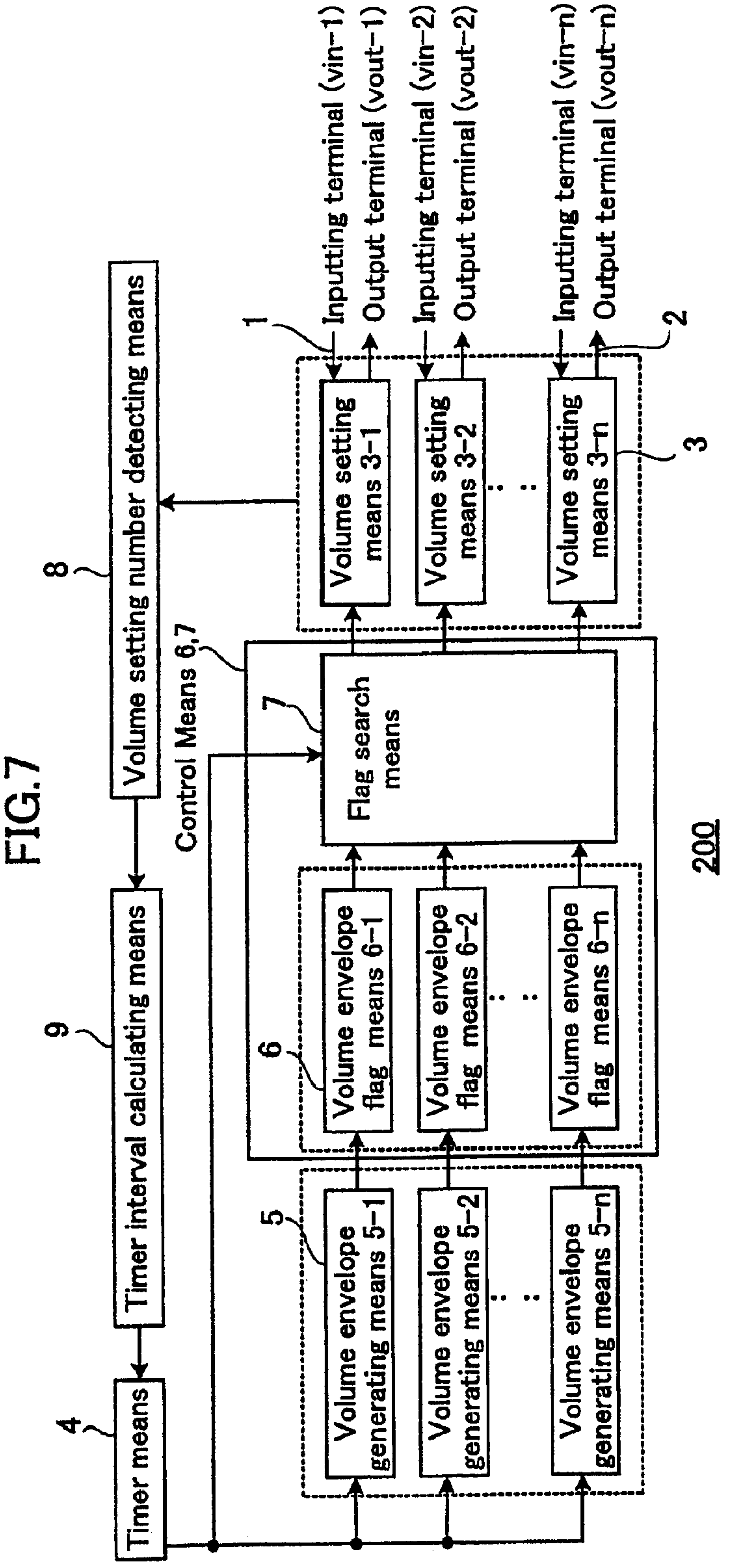
FIG. 7 is a block diagram showing a second embodiment of the volume adjusting apparatus 200 according to the present invention.

Referring to FIG. 7 of the drawings, there is shown a second embodiment of the volume adjusting apparatus 200 according to the present invention. The second embodiment of the volume adjusting apparatus 200 is similar in construction to the first embodiment of the volume adjusting apparatus 100 except for the fact that the volume setting means 3-1 to 3-*n* include inactive volume setting means 3-*k* to 3-*l* not able to respectively set the volume levels of the sound elements v-k to v-1 inputted by the sound inputting terminals 1-*k* to 1-*l* in accordance with the flag data elements outputted by the control means 6, 7 and active volume setting means 3-*m* to 3-*n* able to respectively set the volume levels of the sound elements v-m to v-n inputted by the sound inputting terminals 1-*m* to 1-*n* in accordance with the flag data elements outputted by the control means 6, 7, in which the volume adjusting apparatus 200 farther comprises: volume setting number counting means 8 for counting the number of the active volume setting means 3-*m* to 3-*n*; and timer interval calculating means 9 for calculating the time interval on the basis of the number of the active volume setting means 3-*m* to 3-*n* calculated by the volume setting number counting means 8, and the timer means 4 is operative to output the trigger signal at the time interval calculated by the timer interval calculating means 9.

The inactive volume setting means 3-*k* to 3*l* may be, for example, manufactured as hardware units. The inactive volume setting means 3-*k* to 3-*l* may, for example, manually set the volume levels of the sound elements v-k to v-1 inputted by the sound inputting terminals 1-*k* to 1*l*, but cannot automatically set the volume levels of the sound elements v-k to v-1 inputted by the sound inputting terminals 1-*k* to 1-*l* in accordance with the flag data elements outputted by the control means 6, 7. The active volume setting means 3-*m* to 3-*n*, on the other hand, can respectively set the volume levels of the sound elements v-m to v-n inputted by the sound inputting terminals 1-*m* to 1-*n* in accordance with the flag data elements outputted by the control means 6, 7 at the time interval.

The operations of the volume setting number counting means 8, the timer interval calculating means 9 and the timer means 4 will be described hereinlater. The volume setting number counting means 8 is operated to count the number of the active volume setting means 3-*m* to 3-*n*. The timer interval calculating means 9 is operated to calculate the time interval on the basis of the number of the active volume setting means 3-*m* to 3-*n* calculated by the volume setting number counting means 8, and the timer means 4 is operative to output the trigger signal at the time interval calculated by the timer interval calculating means 9.

In the volume adjusting apparatus 200, the timer interval calculating means 9 may calculate a short time interval if the volume adjusting apparatus 200 comprises a small number of the active volume setting means 3-*m* to 3-*n*. At the shorter time interval, the volume envelope generating means 5-1 to 5-*n* can more accurately generate volume envelope values. The timer interval calculating means 9, on the other hand, may calculate a long time interval if the volume adjusting apparatus 200 comprises a large number of the active volume setting means 3-*m* to 3-*n* so as to provide a sufficient response time to a degree that the volume setting means 3-1 to 3-*n* can respectively set the volume levels of the sound elements vin-1 to vin-n in accordance with the volume envelope values respectively generated by the volume envelope generating means 5-1 to 5-*n*.

From the foregoing description, it is to be understood that the second embodiment of the volume adjusting apparatus 200 according to the present invention, further comprising: volume setting number counting means 8 for counting the number of the active volume setting means 3-*m* to 3-*n*; and timer interval calculating means 9 for calculating the time interval on the basis of the number of the active volume setting means 3-*m* to 3-*n* calculated by the volume setting number counting means 8, can optimize the time interval on the basis of the number of the active volume setting means 3-*m* to 3-*n* to provides a sufficient response time calculated on the basis of the number of the active volume setting means 3-1 to 3-*n* so that the volume setting means 3-1 to 3-*n* can respectively set the volume levels of the sound elements vin-1 to vin-n in accordance with the volume envelope values respectively generated by the volume envelope generating means 5-1 to 5-*n* at the time interval indicated by the timer means 4.

Figure 8:
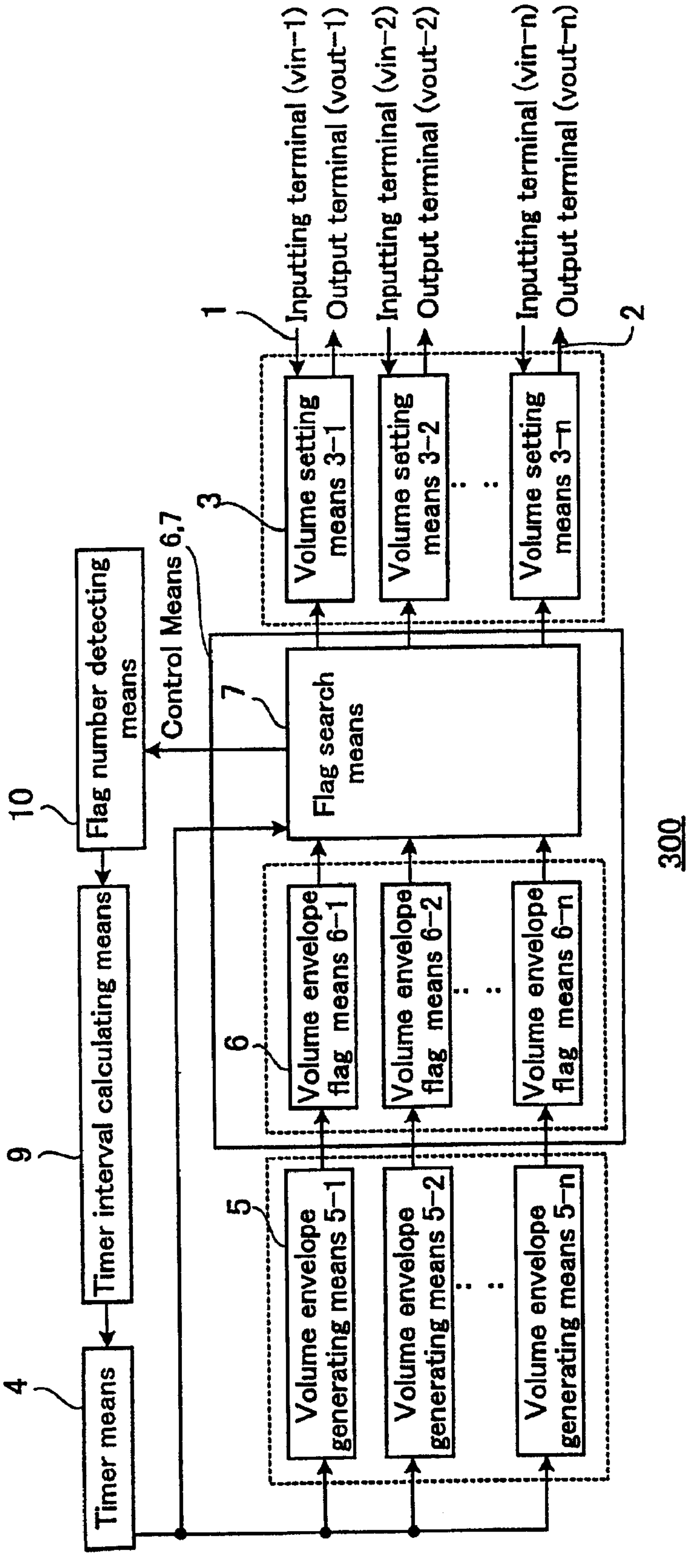
FIG. 8 is a block diagram showing a third embodiment of the volume adjusting apparatus 300 according to the present invention.

Referring to FIG. 8 of the drawings, there is shown a third embodiment of the volume adjusting apparatus 300 according to the present invention. The third embodiment of the volume adjusting apparatus 300 is similar in construction to the first embodiment of the volume adjusting apparatus 100 except for the fact that the volume adjusting apparatus 300 comprises: flag number counting means 10 for counting the number of target volume setting means 3-*i* to 3-*j* which the control means 6, 7 is operative to output the target flag data elements to; and timer interval calculating means 9 for calculating the time interval on the basis of the number of target volume setting means 3-*i* to 3-*j* thus calculated by the flag number counting means 10, in which the timer means 4 is operative to output the trigger signal at the time interval calculated by the timer interval calculating means 9.

The flag number counting means 10 is adapted to count the number of target volume setting means 3-*i* to 3-*j* which the control means 6, 7 is operative to output the target flag data elements to. The timer interval calculating means 9 is adapted to calculate the time interval on the basis of the number of target volume setting means 3-*i* to 3-*j* thus calculated by the flag number counting means 10. The timer means 4 is adapted to output the trigger signal at the time interval calculated by the timer interval calculating means 9.

The operations of the flag number counting means 10 and the timer interval calculating means 9, and the timer means 4 will be described hereinlater.

The flag number counting means 10 is operated to count the number of target volume setting means 3-*i* to 3-*j* which the control means 6, 7 is operative to output the target flag data elements to. The timer interval calculating means 9 is operated to calculate the time interval on the basis of the number of target volume setting means 3-*i* to 3-*j* thus calculated by the flag number counting means 10. The timer means 4 is operated to output the trigger signal at the time interval calculated by the timer interval calculating means 9.

In the volume adjusting apparatus 300, the timer interval calculating means 9 may calculate a short time interval if there are a small number of target volume setting means 3-*i* to 3-*j* which the control means 6, 7 is operative to output the target flag data elements to. At the shorter time interval, the volume envelope generating means 5-1 to 5-*n* can more accurately generate volume envelope values. The timer interval calculating means 9, on the other hand, may calculate a long time interval if there are a large number of target volume setting means 3-*i* to 3-*j* which the control means 6, 7 is operative to output the target flag data elements to so as to provide a sufficient response time to a degree that the volume setting means 3-1 to 3-*n* can respectively set the volume levels of the sound elements vin-1 to vin-n in accordance with the volume envelope values respectively generated by the volume envelope generating means 5-1 to 5-*n* at the time interval.

From the foregoing description, it is to be understood that the third embodiment of the volume adjusting apparatus 300 according to the present invention, further comprising: flag number counting means 10 for counting the number of target volume setting means 3-*i* to 3-*j* which the control means 6, 7 is operative to output the target flag data elements to; and timer interval calculating means 9 for calculating the time interval on the basis of the number of target volume setting means 3-*i* to 3-*j* thus calculated by the flag number counting means 10 can optimize the time interval on the basis of the number of target volume setting means 3-*i* to 3-*j* thus calculated by the flag number counting means 10, to provides a sufficient response time calculated on the basis of the number of the target volume setting means 3-*i* to 3-*j* so that the target volume setting means 3-*i* to 3-*j* can respectively set the volume levels of the sound elements vin-1 to vin-n in accordance with the volume envelope values respectively generated by the volume envelope generating means 5-1 to 5-*n* at the time interval indicated by the timer means 4.

Figure 9:
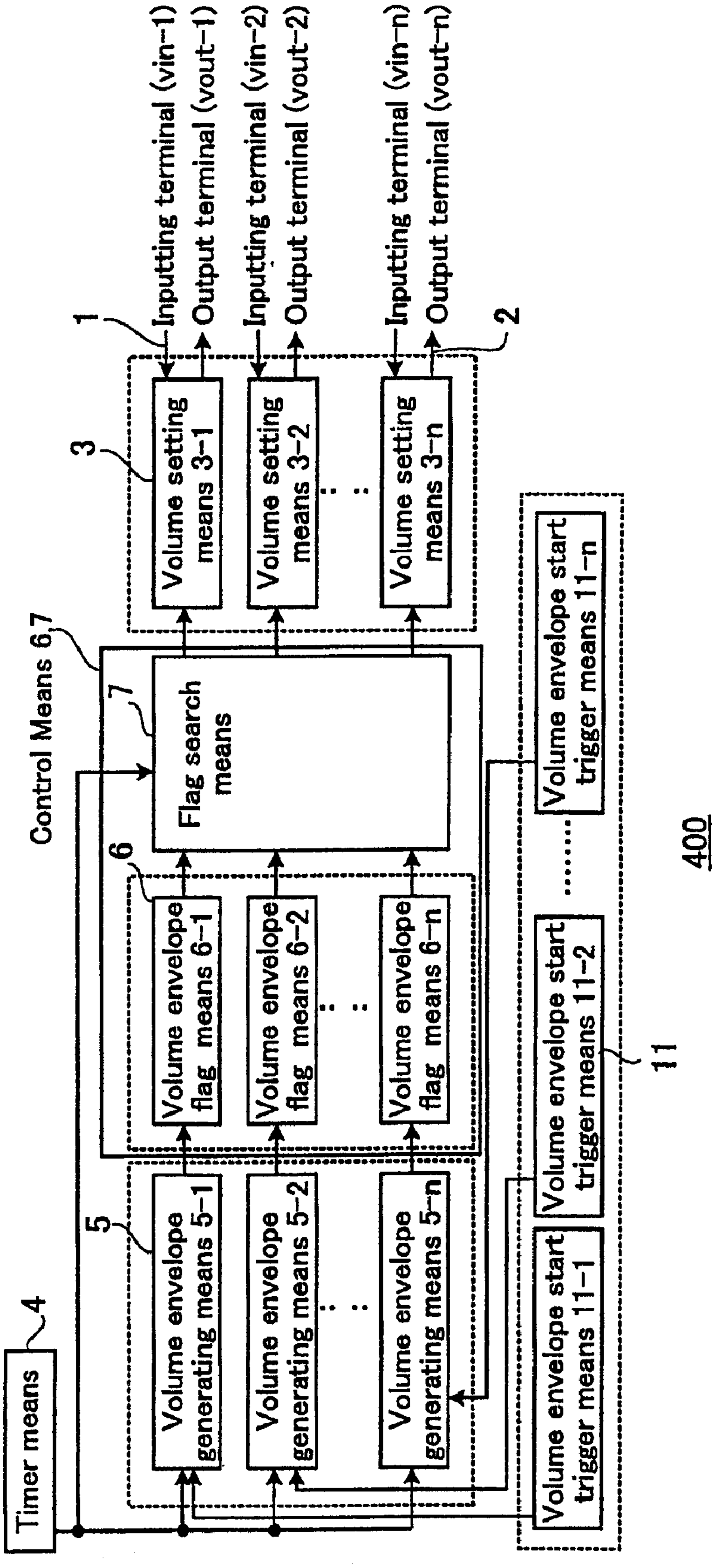
FIG. 9 is a block diagram showing a fourth embodiment of the volume adjusting apparatus 400 according to the present invention.

Referring to FIG. 9 of the drawings, there is shown a fourth embodiment of the volume adjusting apparatus 400 according to the present invention. The fourth embodiment of the volume adjusting apparatus 400 is similar in construction to the first embodiment of the volume adjusting apparatus 100 except for the fact that the volume adjusting apparatus 400 further comprises: volume envelope start trigger means 11-1 to 11-*n* respectively corresponding to the volume envelope generating means 5-1 to 5-*n* each for inputting a trigger operation command therethrough and outputting a trigger signal to corresponding one of the volume envelope generating means 5-1 to 5-*n* in accordance with the trigger operation command, in which one or more of the volume envelope start trigger means 11-*a* to 11-*b* are operated to input the trigger operation commands and output trigger signals to corresponding one or more of the volume envelope generating means 5-*a* to 5-*b* in accordance with the trigger operation commands, and one or more of the volume envelope generating means 5-*a* to 5-*b* respectively corresponding to one or more of the volume envelope start trigger means 11-*a* to 11-*b*.

The volume envelope start trigger means 11-1 to 11-*n* are respectively corresponding to the volume envelope generating means 5-1 to 5-*n*. Each of the volume envelope start trigger means 11-1 to 11-*n* is adapted to input a trigger operation command therethrough and output a trigger signal to corresponding one of the volume envelope generating means 5-1 to 5-*n* in accordance with the trigger operation command. For example, one or more of the volume envelope start trigger means 11-*a* to 11-*b* are operative to input the trigger operation commands and output trigger signals to corresponding one or more of the volume envelope generating means 5-*a* to 5-*b* in accordance with the trigger operation commands. One or more of the volume envelope generating means 5-*a* to 5-*b* respectively corresponding to one or more of the volume envelope start trigger means 11-*a* to 11-*b* are operative to selectively generate volume envelope values for respective volume setting means 3-*a* to 3-*b* in accordance with predetermined envelope forms in response to the trigger signals outputted by one or more of the volume envelope start trigger means 11-*a* to 11-*b* in stead of the trigger signal outputted by the timer means 4.

The operation of the volume envelope start trigger means 11-1 to 11-*n* and one or more of the volume envelope generating means 5-*a* to 5-*b* will be described hereinlater.

One or more of the volume envelope start trigger means 11-*a* to 11-*b* are operated to input the trigger operation commands from, for example, an operator, and output trigger signals to corresponding one or more of the volume envelope generating means 5-*a* to 5-*b* in accordance with the trigger operation commands. The one or more of the volume envelope generating means 5-*a* to 5-*b* respectively corresponding to one or more of the volume envelope start trigger means 11-*a* to 11-*b* are operated to selectively generate volume envelope values for respective volume setting means 3-*a* to 3-*b* in accordance with predetermined envelope forms in response to the trigger signals outputted by one or more of the volume envelope start trigger means 11-*a* to 11-*b* in stead of the trigger signal outputted by the timer means 4.

In the volume adjusting apparatus 400, any one or more of the volume envelope start trigger means 11-*a* to 11-*b* may input trigger operation commands therethrough and output trigger signals to corresponding one or more of the volume envelope generating means 5-*a* to 5-*b* at any time.

From the foregoing description, it is to be understood that the volume adjusting apparatus 400 according to the present invention, in which the volume envelope start trigger means 11-*a* to 11-*b* can directly output trigger signals to any one or more of the volume envelope generating means 5-*a* to 5-*b* at any time in accordance with an operation command by an operator, can improve the response time of the volume adjusting apparatus.

Figure 10:
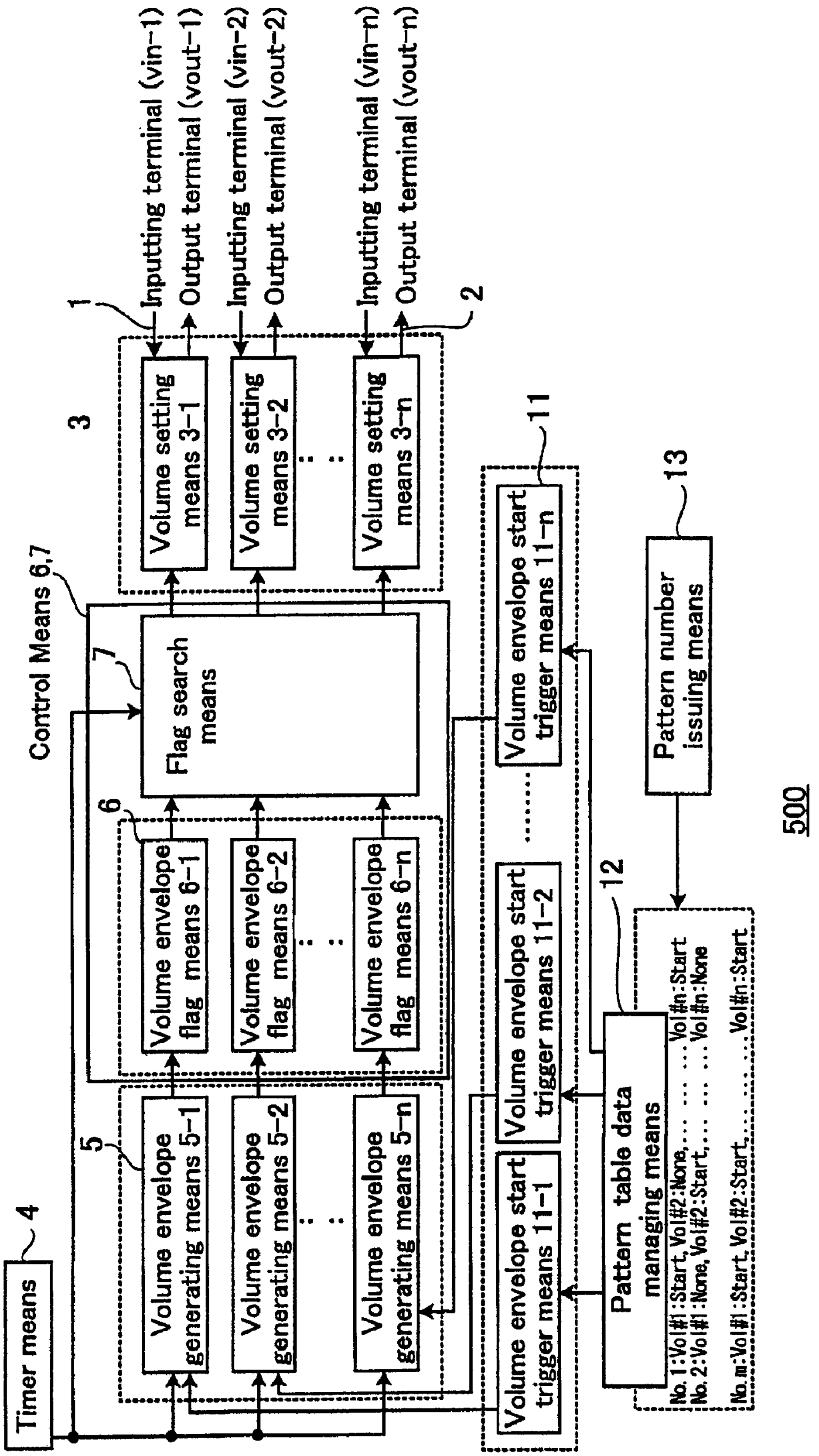
FIG. 10 is a block diagram showing a fifth embodiment of the volume adjusting apparatus 500 according to the present invention.

Referring to FIG. 10 of the drawings, there is shown a fifth embodiment of the volume adjusting apparatus 500 according to the present invention. The fifth embodiment of the volume adjusting apparatus 500 is similar in construction to the first embodiment of the volume adjusting apparatus 100 except for the fact that the volume adjusting apparatus 500 further comprises: pattern table data managing means 12 for storing volume envelope start trigger pattern table data elements respectively associated with pattern numbers; and pattern number issuing means 13 for issuing a pattern number, in which the pattern table data managing means 12 is operative to respectively output volume envelope start trigger pattern table data elements for the volume envelope generating means 5-1 to 5-*n* in response to the pattern number issued by the pattern number issuing means 13, and the volume envelope generating means 5-1 to 5-*n* respectively corresponding to the volume setting means 3-1 to 3-*n* are operative to selectively generate volume envelope values for respective volume setting means 3-1 to 3-*n* in accordance with predetermined envelope forms in response to the volume envelope start trigger pattern table data elements outputted by the pattern table data managing means 12.

The pattern table data managing means 12 is adapted to store volume envelope start trigger pattern table data elements respectively associated with pattern numbers. The volume envelope start trigger pattern table data elements include volume envelope start trigger pattern data elements required to start to generate volume envelopes in accordance with time. The volume envelope start trigger pattern data elements include, for example but not limited to, "Attack Gain", "Attack Time", "Release Gain", and "Release Time".

The pattern number issuing means 13 is adapted to issue a pattern number in accordance with, for example, an operation by an operator. The operator, who is informed of, for example, the states of each of the volume envelope generating means 5-1 to 5-*n*, i.e., whether any one of volume envelope values for the volume setting means 3-1 to 3-*n* respectively generated by the volume envelope generating means 5-1 to 5-*n* remains unchanged or not, can effectively operate the volume envelope generating means 5-1 to 5-*n*. The pattern table data managing means 12 is operative to respectively output volume envelope start trigger pattern table data elements for the volume envelope generating means 5-1 to 5-*n* in response to the pattern number issued by the pattern number issuing means 13. The volume envelope generating means 5-1 to 5-*n* respectively corresponding to the volume setting means 3-1 to 3-*n* are operative to selectively generate volume envelope values for respective volume setting means 3-1 to 3-*n* in accordance with predetermined envelope forms in response to the volume envelope start trigger pattern table data elements outputted by the pattern table data managing means 12.

The description hereinlater will be directed to the operation of the pattern table data managing means 12, and the pattern number issuing means 13.

The pattern table data managing means 12 is operated to store volume envelope start trigger pattern table data elements respectively associated with pattern numbers. The pattern number issuing means 13 is operated to issue a pattern number in accordance with, for example, an operation by an operator. The pattern table data managing means 12 is operated to respectively output volume envelope start trigger pattern table data elements for the volume envelope generating means 5-1 to 5-*n* in response to the pattern number issued by the pattern number issuing means 13. The volume envelope generating means 5-1 to 5-*n* respectively corresponding to the volume setting means 3-1 to 3-*n* are operative to selectively generate volume envelope values for respective volume setting means 3-1 to 3-*n* in accordance with predetermined envelope forms in response to the volume envelope start trigger pattern table data elements outputted by the pattern table data managing means 12.

The fifth embodiment of the volume adjusting apparatus 500 thus constructed can output selectively generate volume envelope values for respective volume setting means 3-1 to 3-*n* in accordance with predetermined envelope forms in response to the volume envelope start trigger pattern table data elements outputted by the pattern table data managing means 12 in response to the pattern number issued by the pattern number issuing means 13 operated by, for example an operator, thereby make it possible to improve the response time of the volume adjusting apparatus.

Figure 11:
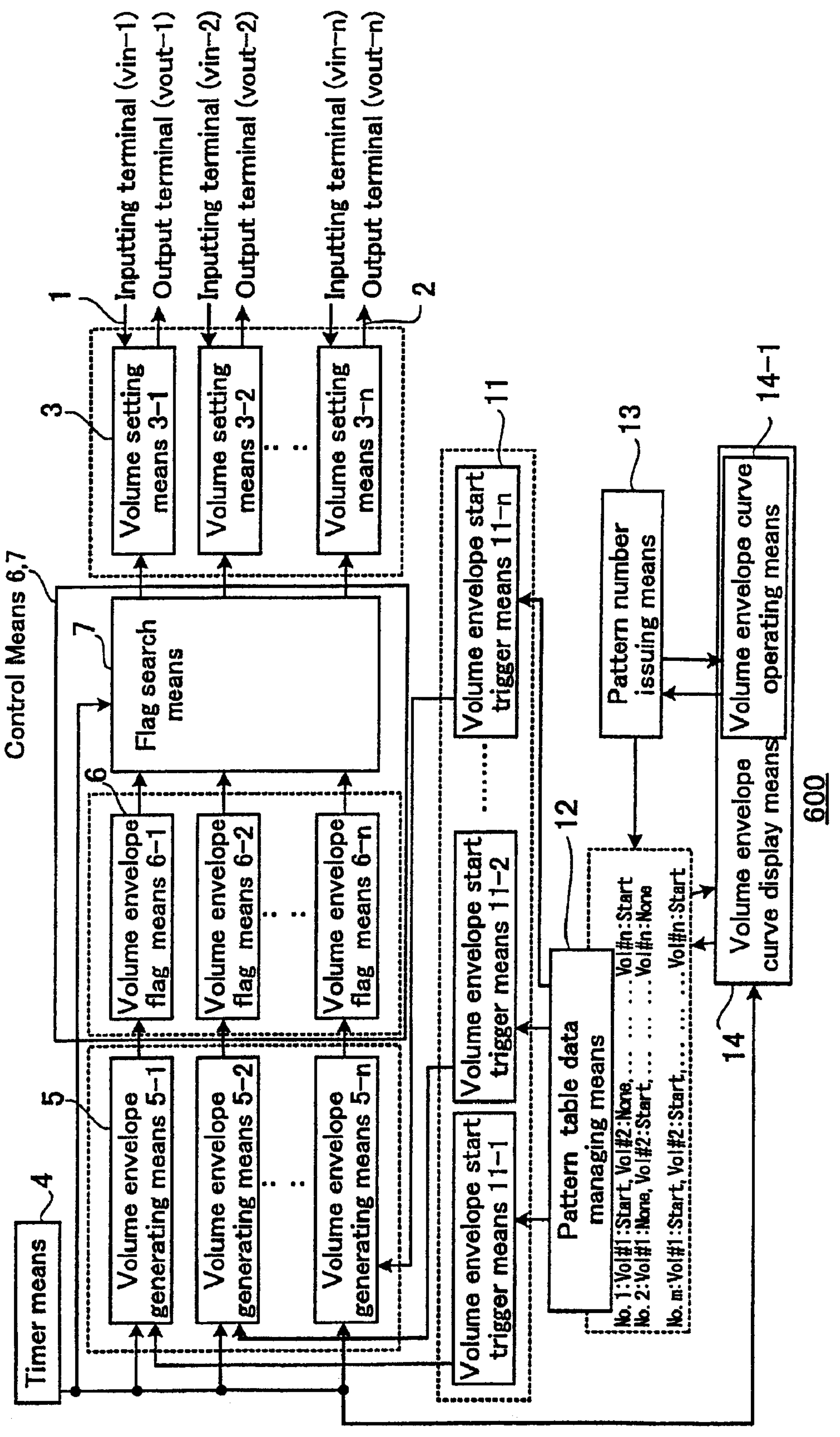
FIG. 11 is a block diagram showing a sixth embodiment of the volume adjusting apparatus 600 according to the present invention.

Referring to FIG. 11 of the drawings, there is shown a sixth embodiment of the volume adjusting apparatus 600 according to the present invention. The sixth embodiment of the volume adjusting apparatus 600 is similar in construction to the fifth embodiment of the volume adjusting apparatus 500 except for the fact that the volume adjusting apparatus 600 further comprises volume envelope curve display means 14 for inputting the pattern number issued by the pattern number issuing means 13, the volume envelope start trigger pattern table data elements for the volume envelope generating means 5-1 to 5-*n* outputted by the pattern table data managing means 12 in response to the pattern number issued by the pattern number issuing means 13 the trigger signal outputted by the timer means 4 to respectively calculate volume envelope curves for the volume setting means 3-1 to 3-*n* respectively corresponding to the volume envelope generating means 5-1 to 5-*n* to be displayed in response to the trigger signal outputted by the timer means 4 at the time interval.

The volume envelope curve display means 14 is adapted to input the pattern number issued by the pattern number issuing means 13, the volume envelope start trigger pattern table data elements for the volume envelope generating means 5-1 to 5-*n* outputted by the pattern table data managing means 12 in response to the pattern number issued by the pattern number issuing means 13, and the trigger signal outputted by the timer means 4 to respectively calculate volume envelope curves for the volume setting means 3-1 to 3-*n* respectively corresponding to the volume envelope generating means 5-1 to 5-*n* to be displayed in response to the trigger signal outputted by the timer means 4 at the time interval. The volume envelope curve display means 14 may be connected with, for example, a display unit such as Liquid-Crystal Display unit which permits to display volume envelope curves thus calculated for the volume setting means 3-1 to 3-*n* respectively corresponding to the volume envelope generating means 5-1 to 5-*n* in response to the trigger signal outputted by the timer means 4 at the time interval.

The volume adjusting apparatus 600 thus constructed makes it possible for an operator to monitor the volume envelope curves thus calculated for the volume setting means 3-1 to 3-*n* respectively corresponding to the volume envelope generating means 5-1 to 5-*n* to observe the states of each of the volume envelope generating means 5-1 to 5-*n*, for example, whether any one of volume envelope values for the volume setting means 3-1 to 3-*n* respectively generated by the volume envelope generating means 5-1 to 5-*n* remains unchanged to effectively operate the volume envelope generating means 5-1 to 5-*n* at the time interval using the pattern number issuing means 13, thereby enabling to improve the response time of the volume adjusting apparatus.

In the volume adjusting apparatus 600, the volume envelope curve display means 14 may further include: a volume envelope curve operating means 14-1 for inputting an operating command such as, for example, a first operating command and a second operating command therethrough. The volume envelope curve operating means 14-1 is adapted to input an operating command therethrough. The operating command includes a first operating command and a second operating command. The pattern number issuing means 13 is operative to issue a pattern number in response to the first operating command inputted by the volume envelope curve operating means 14-1. The pattern table data managing means 12 is operative to respectively output volume envelope start trigger pattern table data elements for the volume envelope generating means 5-1 to 5-*n* in response to the second operating command inputted by the volume envelope curve operating means 14-1. The volume envelope curve display means 14 including the volume envelope curve operating means 14-1 can be used not only as display means but also as a user interface having an operating function.

The sixth embodiment of the volume adjusting apparatus 600 according to the present invention comprising volume envelope curve display means 14 including the volume envelope curve operating means 14-1 makes it possible for an operator to monitor the volume envelope curves thus calculated for the volume setting means 3-1 to 3-*n* respectively corresponding to the volume envelope generating means 5-1 to 5-*n* to observe the states of each of the volume envelope generating means 5-1 to 5-*n*, for example, whether any one of volume envelope values for the volume setting means 3-1 to 3-*n* respectively generated by the volume envelope generating means 5-1 to 5-*n* remains unchanged to effectively operate volume envelope generating means 5-1 to 5-*n* at the time interval using the volume envelope curve display means 14 including the volume envelope curve operating means 14-1, thereby enabling to improve the response time of the volume adjusting apparatus.

Figure 12:
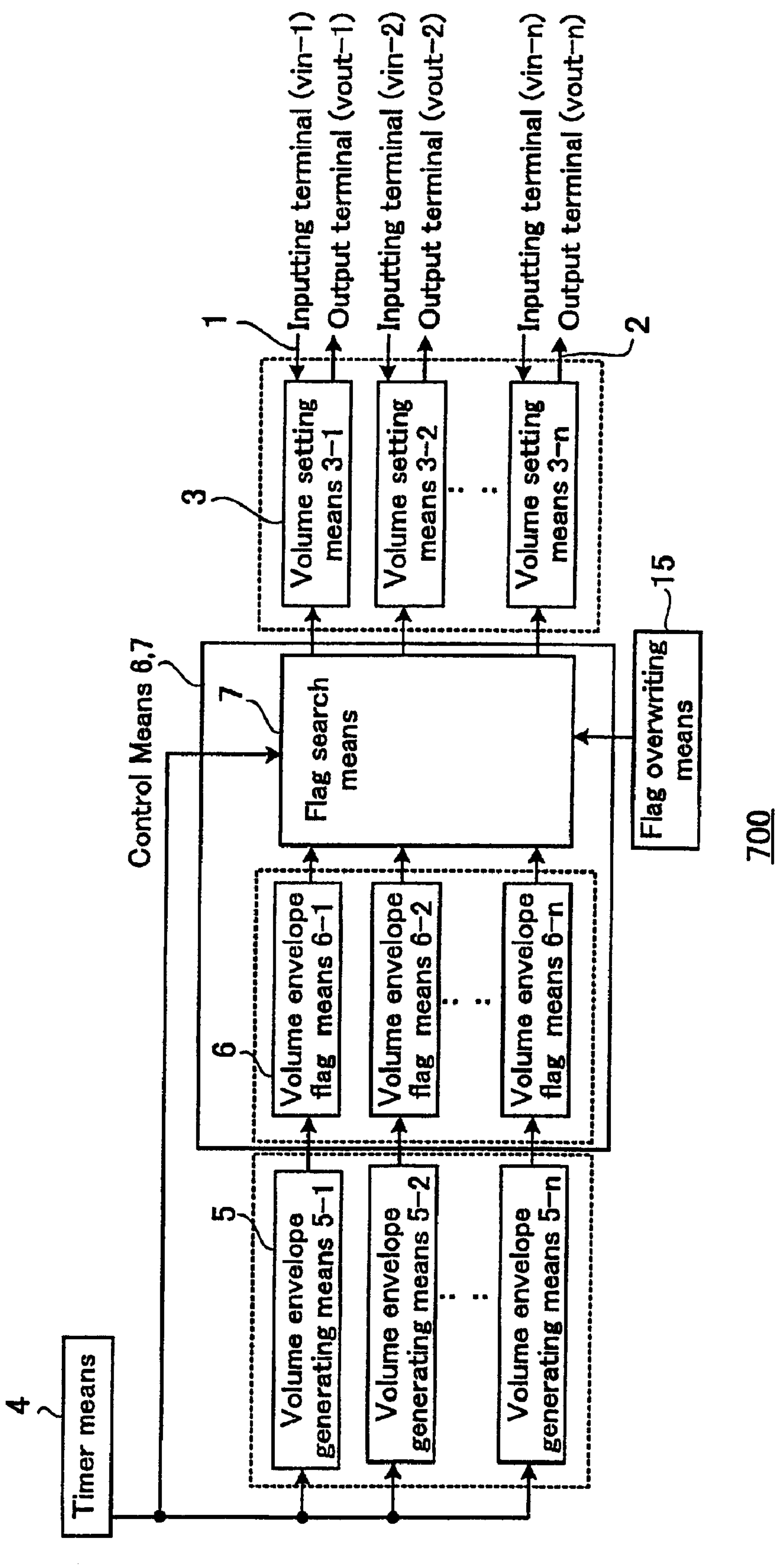
FIG. 12 is a block diagram showing a seventh embodiment of the volume adjusting apparatus 700 according to the present invention.

Referring to FIG. 12 of the drawings, there is shown a seventh embodiment of the volume adjusting apparatus 700 according to the present invention. The seventh embodiment of the volume adjusting apparatus 700 is similar in construction to the first embodiment of the volume adjusting apparatus 100 except for the fact that the volume adjusting apparatus 700 further comprises flag overwriting means 15 for overwriting the flag data elements for specified volume setting means 3-*o* to 3-*p* generated by the control means 6, 7 with specified flag data elements so that control means 6, 7 is operative to respectively output the specified flag data elements for the specified volume setting means 3-*o* to 3-*p* to the specified volume setting means 3-*o* to 3-*p*, in which the specified volume setting means 3-*o* to 3-*p* are operative to respectively set the volume levels of the sound elements v-o to v-p inputted by the sound inputting terminals 1-*o* to 1-*p* in accordance with the specified flag data elements outputted by the control means 6, 7.

The flag overwriting means 15 is operative to overwrite the flag data elements for specified volume setting means 3-*o* to 3-*p* generated by the control means 6, 7 with specified flag data elements so that control means 6, 7 is operative to respectively output the specified flag data elements for specified volume setting means 3-*o* to 3-*p*. The flag overwriting means 15 may input the specified flag data elements in accordance with an operation by, for example, an operator. More specifically, the specified volume setting means 3-*o* to 3-*p* are operative to respectively set the volume levels of the sound elements v-o to v-p inputted by the sound inputting terminals 1-*o* to 1-*p* in accordance with the specified flag data elements outputted by the control means 6, 7 independently of the volume envelope generating means 5-*o* to 5-*p* when the flag overwriting means 15 is operated. The specified volume setting means 3-*o* to 3-*p* can start to respectively set the volume levels of the sound elements v-o to v-p inputted by the sound inputting terminals 1-*o* to 1-*p* in accordance with the target flag data elements outputted by the control means 6, 7 as soon as the flag overwriting means 15 is not operated.

The seventh embodiment of the volume adjusting apparatus 700 thus constructed makes it possible for an operator to set the specified volume setting means 3-*o* to 3-*p* using the flag overwriting means 15 so that the specified volume setting means 3-*o* to 3-*p* are operative to respectively set the volume levels of the sound elements v-o to v-p inputted by the sound inputting terminals 1-*o* to 1-*p* in accordance with the specified flag data elements outputted by the control means 6, 7, thereby improving the response time of the volume adjusting apparatus.

Furthermore, the specified flag data elements may be, for example, mute flag data elements and the specified volume setting means 3-*o* to 3-*p* are operative to respectively set the volume levels of the sound elements v-o to v-p inputted by the sound inputting terminals 1-*o* to 1-*p* to mute state in accordance with the mute flag data elements outputted by the control means 6, 7. More specifically, the specified volume setting means 3-*o* to 3-*p* are operative to respectively set the volume levels of the sound elements v-o to v-p inputted by the sound inputting terminals 1-*o* to 1-*p* to mute state in accordance with the mute flag data elements outputted by the control means 6, 7 independently of the volume envelope generating means 5-*o* to 5-*p* when the flag overwriting means 15 is operated. The specified volume setting means 3-*o* to 3-*p* can start respectively set the volume levels of the sound elements v-o to v-p inputted by the sound inputting terminals 1-*o* to 1-*p* in accordance with the target flag data elements outputted by the control means 6, 7 as soon as the flag overwriting means 15 is not operated.

This means that the flag overwriting means 15 may input the mute flag data elements in accordance with an operation by, for example, an operator and overwrite the flag data elements for specified volume setting means 3-*o* to 3-*p* generated by the control means 6, 7 with the mute flag data elements so that control means 6, 7 is operative to respectively output the mute flag data elements for specified volume setting means 3-*o* to 3-*p*. The specified volume setting means 3-*o* to 3-*p* are operative to respectively set the volume levels of the sound elements v-o to v-p inputted by the sound inputting terminals 1-*o* to 1-*p* directly in accordance with the mute flag data elements to mute state, thereby improving the response time of the volume adjusting apparatus.

Figure 13:
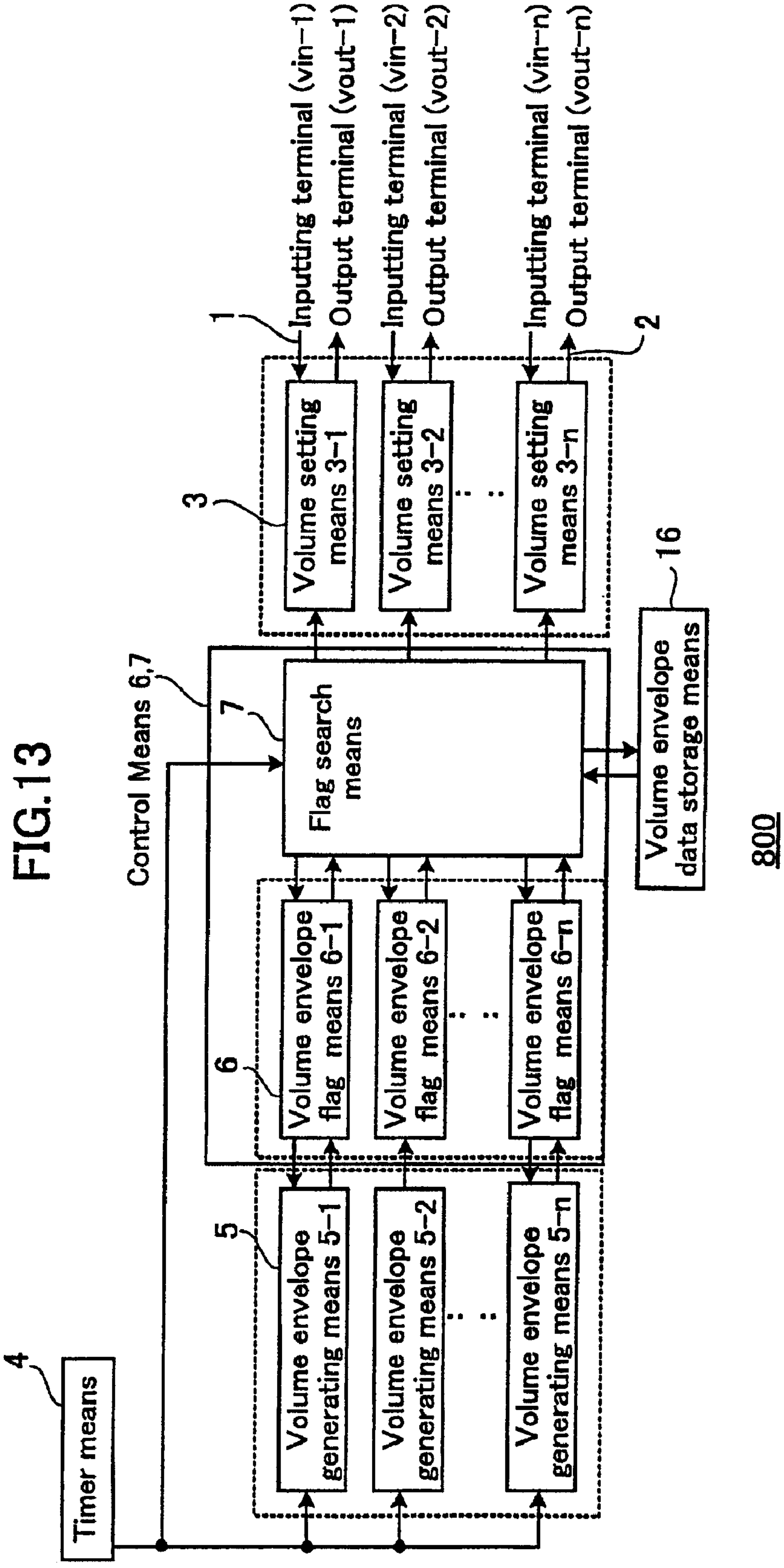
FIG. 13 is a block diagram showing an eighth embodiment of the volume adjusting apparatus 800 according to the present invention.
Figure 14:
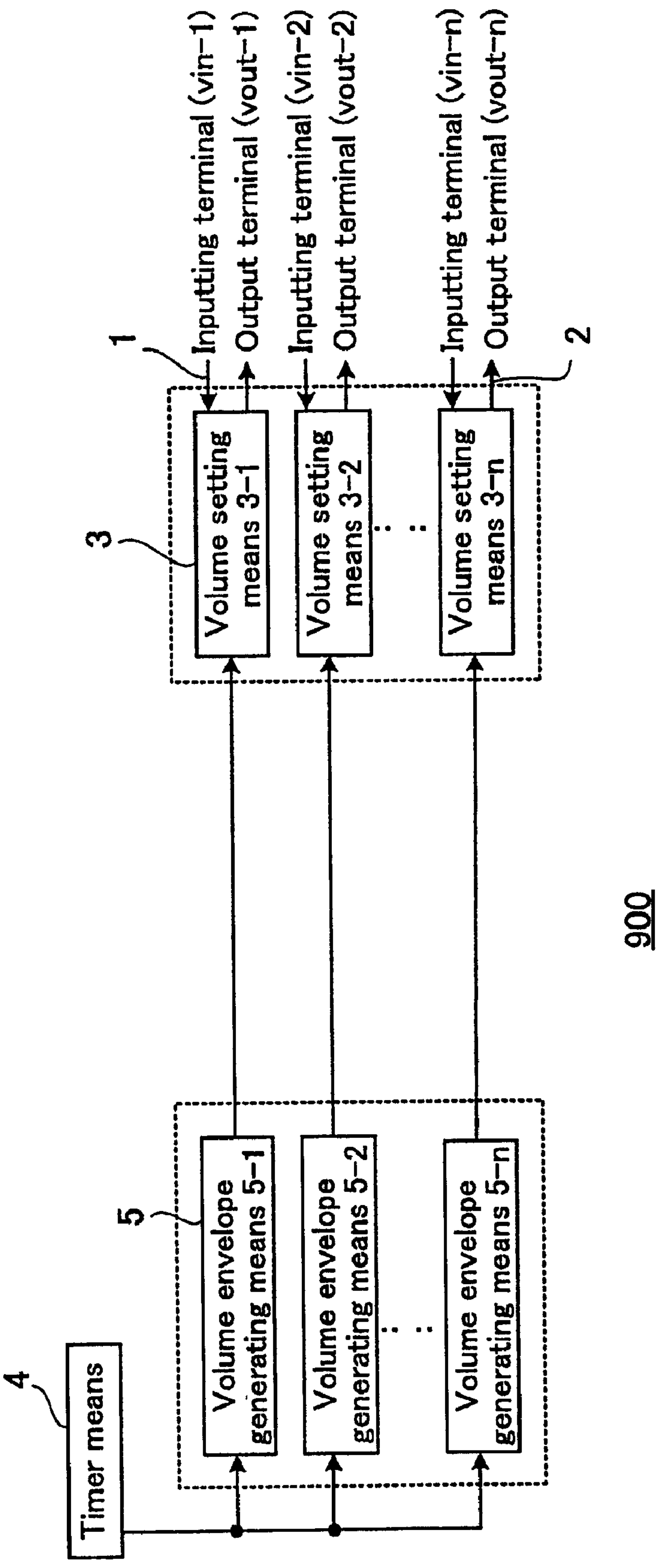
FIG.14 PRIOR ART
FIG. 14 is a block diagram showing the conventional volume adjusting apparatus 900.

Referring to FIG. 13 of the drawings, there is shown an eighth embodiment of the volume adjusting apparatus 800 according to the present invention. The eighth embodiment of the volume adjusting apparatus 800 is similar in construction to the first embodiment of the volume adjusting apparatus 100 except for the fact that the volume adjusting apparatus 800 further comprises volume envelope data storage means 16 for storing volume envelope data elements forming part of the flag data elements.

The volume envelope data storage means 16 is adapted to store volume envelope data elements forming part of the flag data elements. The volume envelope data elements may include, for example but not limited to, "Attack Gain" data elements, "Attack Time" data elements, "Release Gain" data elements, "Release Time" data elements, "Attack Time" stat time data elements, and "Release Time" start time data elements.

The description hereinlater will be directed to the operation of the volume envelope data storage means 16.

The volume envelope data storage means 16 is operated to store volume envelope data elements forming part of the flag data elements. The control means 6, 7 is operated to input the volume envelope data elements stored in the volume envelope data storage means 16. The control means 6, 7 is then operated to judge if the volume envelope data elements thus inputted are equivalent to the flag data elements at the time interval, and respectively output the volume envelope data elements thus inputted to volume setting means 3-1 to 3-*n* if it is judged that the volume envelope data elements thus inputted are equivalent to the flag data elements at the time interval. Otherwise, the control means 6, 7 are operated to transmit a volume envelope start request to the volume envelope generating means 5-1 to 5-*n* to selectively generate volume envelope values for respective volume setting means 3-1 to 3-*n* on the basis of the volume envelope data elements.

The volume envelope generating means 5-1 to 5-*n* respectively corresponding to the volume setting means 3-1 to 3-*n* are operated to selectively generate volume envelope values for respective volume setting means 3-1 to 3-*n* in accordance with predetermined envelope forms on the basis of the volume envelope start request transmitted by the control means 6, 7. The control means 6, 7 is then operated to input volume envelope values for respective volume setting means 3-1 to 3-*n* respectively generated by the volume envelope generating means 5-1 to 5-*n* on the basis of the volume envelope start request transmitted by the control means 6, 7, selectively generate target flag data elements on the basis of differences of the volume envelope values for target volume setting means 3-*i* to 3-*j* at the time interval for the volume envelope values changed at the time interval for the target volume setting means 3-*i* to 3-*j* and generate non-target flag data elements for non-target volume setting means 3-1 to 3-*n* other than the target volume setting means 3-*i* to 3-*j* at the time interval for the volume envelope values unchanged at the time interval for non-target volume setting means 3-1 to 3-*n* other than the target volume setting means 3-*i* to 3-*j*, search the target flag data elements from among the flag data elements thus generated to determine target volume setting means 3-*i* to 3-*j* respectively corresponding to the target volume envelope generating means (5-*i* to 5-*j*) which respectively generated volume envelope values changed at the time interval for the target volume setting means 3-*i* to 3-*j*, and respectively output the target flag data elements to the target volume setting means 3-*i* to 3-*j* in response to the trigger signal outputted by the timer means 4 at the time interval.

The target volume setting means 3-*i* to 3-*j* are operated to respectively set the volume levels of the target sound elements v-i to v-j inputted by the target sound inputting terminals 1-*i* to 1-*j* in accordance with the target flag data elements outputted by the control means 6, 7.

The eight embodiment of the volume adjusting apparatus 800 according to the present invention, in which the volume envelope data storage means 16 stores volume envelope data elements forming part of the flag data elements, in which the control means 6, 7 is operated to input the volume envelope data elements stored in the volume envelope data storage means 16 and then operated to judge if the volume envelope data elements thus inputted are equivalent to the flag data elements at the time interval, and respectively output the volume envelope data elements thus inputted to volume setting means 3-1 to 3-*n* if it is judged that the volume envelope data elements thus inputted are equivalent to the flag data elements at the time interval, can illuminate the need for the volume envelope generating means 5-1 to 5-*n* to selectively generate volume envelope values for respective volume setting means 3-1 to 3-*n* when the volume envelope data elements thus inputted are equivalent to the flag data elements, thereby reducing the response time.

The volume setting means 3-1 to 3-*n* have been described as n units of the volume setting means for simplicity and better understanding. Alternatively, a plurality of volume setting means may be combined in one device or one hardware unit. Furthermore, the function of the timer means 4 may be carried out by, for example, a software time interrupt module, a software counter module, or a hardware pulse counter. The volume envelopes are not necessarily sound pressure curves, but may include, for example, approximate line curves, and sequential line curves.

Furthermore, the above embodiments of the volume adjusting apparatus according to the present invention may be performed by executing a computer program recoded on a computer usable storage medium having computer readable code embodied therein for adjusting volumes. The computer may be a microcomputer, the other computer, a device comprising a microcomputer, or the like.

The many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described herein, and accordingly, all suitable modifications and equivalents may be construed as being encompassed within the scope of the invention.

What is claimed is:

1. A volume adjusting apparatus comprising:

a plurality of sound inputting terminals for respectively inputting sound elements;

a plurality of volume setting means respectively connected with said sound inputting terminals to respectively set volume levels of said sound elements inputted by said sound inputting terminals; and a plurality of sound outputting terminals for respectively outputting said sound elements at said volume levels respectively set by said volume setting means;

whereby said volume adjusting apparatus further comprises:

timer means for outputting a trigger signal at a time interval;

a plurality of volume envelope generating means respectively corresponding to said volume setting means for selectively generating volume envelope values for respective volume setting means in accordance with predetermined envelope forms in response to said trigger signal outputted by said timer means at said time interval; and control means for inputting volume envelope values for respective volume setting means respectively generated by said volume envelope generating means in response to said trigger signal outputted by said timer means at said time interval, selectively generating target flag data elements on the basis of differences of said volume envelope values for target volume setting means at said time interval for said volume envelope values changed at said time interval for said target volume setting means and generating non-target flag data elements for non-target volume setting means other than said target volume setting means at said time interval for said volume envelope values unchanged at said time interval for non-target volume setting means other than said target volume setting means, searching said target flag data elements from among said flag data elements thus generated to determine target volume setting means respectively corresponding to target volume envelope generating means which respectively generated volume envelope values changed at said time interval for said target volume setting means, and respectively outputting said target flag data elements to said target volume setting means in response to said trigger signal outputted by said timer means at said time interval; and said target volume setting means are operative to respectively set said volume levels of target sound elements inputted by target sound inputting terminals in accordance with said target flag data elements outputted by said control means.

2. A volume adjusting apparatus as set forth in claim 1, in which said control means includes:

a plurality of volume envelope flag means respectively corresponding to said volume envelope generating means for inputting volume envelope values for respective volume setting means respectively generated by said volume envelope generating means at said time interval, and selectively generating target flag data elements on the basis of differences of said volume envelope values for target volume setting means at said time interval for said volume envelope values changed at said time interval for said target volume setting means and generating non-target flag data elements for non-target volume setting means other than said target volume setting means at said time interval for said volume envelope values unchanged at said time interval for non-target volume setting means other than said target volume setting means; and flag search means for said searching target flag data elements from among said flag data elements thus generated to determine target volume setting means respectively corresponding to target volume envelope generating means which respectively generated volume envelope values changed at said time interval for said target volume setting means, and respectively outputting said target flag data elements to said target volume setting means in response to said trigger signal outputted by said timer means at said time interval.

3. A volume adjusting apparatus as set forth in claim 1, in which said volume setting means include inactive volume setting means not able to respectively set said volume levels of said sound elements inputted by said sound inputting terminals in accordance with said flag data elements outputted by said control means and active volume setting means able to respectively set said volume levels of said sound elements inputted by said sound inputting terminals in accordance with said flag data elements outputted by said control means, and which further comprising:

volume setting number counting means for counting the number of said active volume setting means; and timer interval calculating means for calculating said time interval on the basis of the number of said active volume setting means calculated by said volume setting number counting means, said timer means is operative to output said trigger signal at said time interval calculated by said timer interval calculating means.

4. A volume adjusting apparatus as set forth in claim 1 further comprising:

flag number counting means for counting the number of target volume setting means which said control means is operative to output said target flag data elements to; and timer interval calculating means for calculating said time interval on the basis of the number of target volume setting means thus calculated by said flag number counting means, said timer means is operative to output said trigger signal at said time interval calculated by said timer interval calculating means.

5. A volume adjusting apparatus as set forth in claim 1 further comprising:

volume envelope start trigger means respectively corresponding to said volume envelope generating means each for inputting a trigger operation command therethrough and outputting a trigger signal to corresponding one of said volume envelope generating means in accordance with said trigger operation command, in which one or more of said volume envelope start trigger means are operated to input said trigger operation commands and output trigger signals to corresponding one or more of said volume envelope generating means in accordance with said trigger operation commands, and said one or more of said volume envelope generating means respectively corresponding to one or more of said volume envelope start trigger means are operative to selectively generate volume envelope values for respective volume setting means in accordance with predetermined envelope forms in response to said trigger signals outputted by one or more of said volume envelope start trigger means.

6. A volume adjusting apparatus as set forth in claim 5 further comprising:

pattern table data managing means for storing volume envelope start trigger pattern table data elements respectively associated with pattern numbers; and pattern number issuing means for issuing a pattern number, in which said pattern table data managing means is operative to respectively output volume envelope start trigger pattern table data elements for said volume envelope generating means in response to said pattern number issued by said pattern number issuing means, and said volume envelope generating means respectively corresponding to said volume setting means are operative to selectively generate volume envelope values for respective volume setting means in accordance with predetermined envelope forms in response to said volume envelope start trigger pattern table data elements outputted by said pattern table data managing means.

7. A volume adjusting apparatus as set forth in claim 1 further comprising:

volume envelope curve display means for inputting said pattern number issued by said pattern number issuing means, said volume envelope start trigger pattern table data elements for said volume envelope generating means outputted by said pattern table data managing means in response to said pattern number issued by said pattern number issuing means, and said trigger signal outputted by said timer means to respectively calculate volume envelope curves for said volume setting means respectively corresponding to said volume envelope generating means to be displayed in response to said trigger signal outputted by said timer means at said time interval.

8. A volume adjusting apparatus as set forth in 7 in which said volume envelope curve display means includes:

volume envelope curve operating means for inputting an operating command including a first operating command and a second operating command therethrough, said pattern number issuing means is operative to issue a pattern number in response to said first operating command inputted by said volume envelope curve operating means, and said pattern table data managing means is operative to respectively output volume envelope start trigger pattern table data elements for said volume envelope generating means in response to said second operating command inputted by said volume envelope curve operating means.

9. A volume adjusting apparatus as set forth in claim 1 further comprising:

flag overwriting means for overwriting said flag data elements for specified volume setting means generated by said control means with specified flag data elements so that control means is operative to respectively output said specified flag data elements for said specified volume setting means to said specified volume setting means, in which said specified volume setting means are operative to respectively set said volume levels of said sound elements inputted by said sound inputting terminals in accordance with said specified flag data elements outputted by said control means.

10. A volume adjusting apparatus as set forth in claim 9 in which said specified flag data elements are mute flag data elements, and said specified volume setting means are operative to respectively set said volume levels of said sound elements inputted by said sound inputting terminals to mute state in accordance with said mute flag data elements outputted by said control means.

11. A volume adjusting apparatus as set forth in claim 1 further comprising:

volume envelope data storage means for storing volume envelope data elements forming part of said flag data elements, in which said control means is operative to input said volume envelope data elements stored in said volume envelope data storage means, judge if said volume envelope data elements thus inputted are equivalent to said flag data elements at said time interval, and respectively output said volume envelope data elements thus inputted to volume setting means if it is judged that said volume envelope data elements thus inputted are equivalent to said flag data elements at said time interval and, otherwise, transmit a volume envelope start request to said volume envelope generating means to selectively generate volume envelope values for respective volume setting means on the basis of said volume envelope data elements, in which said volume envelope generating means respectively corresponding to said volume setting means are operative to selectively generate volume envelope values for respective volume setting means in accordance with predetermined envelope forms on the basis of said volume envelope start request transmitted by said control means, said control means is operative to input volume envelope values for respective volume setting means respectively generated by said volume envelope generating means on the basis of said volume envelope start request transmitted by said control means, selectively generate target flag data elements on the basis of differences of said volume envelope values for target volume setting means at said time interval for said volume envelope values changed at said time interval for said target volume setting means and generate non-target flag data elements for non-target volume setting means other than said target volume setting means at said time interval for said volume envelope values unchanged at said time interval for non-target volume setting means other than said target volume setting means, search said target flag data elements from among said flag data elements thus generated to determine target volume setting means respectively corresponding to target volume envelope generating means which respectively generated volume envelope values changed at said time interval for said target volume setting means, and respectively output said target flag data elements to said target volume setting means in response to said trigger signal outputted by said timer means at said time interval; and said target volume setting means are operative to respectively set said volume levels of said target sound elements inputted by said target sound inputting terminals in accordance with said target flag data elements outputted by said control means.

12. A volume adjusting method comprising the steps of:

a plurality of sound inputting steps (1—1 to 1-*n*) of respectively inputting sound elements;

a plurality of volume setting steps (3-1 to 3-*n*) respectively connected with said sound inputting steps (1—1 to 1-*n*) of respectively setting volume levels of said sound elements inputted in said sound inputting steps (1—1 to 1-*n*); and a plurality of sound outputting steps (2-1 to 2-*n*) of respectively outputting said sound elements at said volume levels respectively set in said volume setting steps (3-1 to 3-*n*);

whereby said volume adjusting method further comprises the steps of:

timer step (4) of outputting a trigger signal at a time interval;

a plurality of volume envelope generating steps (5-1 to 5-*n*) respectively corresponding to said volume setting steps (3-1 to 3-*n*) of selectively generating volume envelope values for respective volume setting steps (3-1 to 3-*n*) in accordance with predetermined envelope forms in response to said trigger signal outputted in said timer step (4) at said time interval; and control step (6, 7) of inputting volume envelope values for respective volume setting steps (3-1 to 3-*n*) respectively generated in said volume envelope generating steps (5-1 to 5-*n*) in response to said trigger signal outputted in said timer step (4) at said time interval, selectively generating target flag data elements on the basis of differences of said volume envelope values for target volume setting steps (3-*i* to 3-*j*) at said time interval for said volume envelope values changed at said time interval for said target volume setting steps (3-*i* to 3-*j*) and generating non-target flag data elements for non-target volume setting steps (3-1 to 3-*n*) other than said target volume setting steps (3-*i* to 3-*j*) at said time interval for said volume envelope values unchanged at said time interval for non-target volume setting steps (3-1 to 3-*n*) other than said target volume setting steps (3-*i* to 3-*j*), searching said target flag data elements from among said flag data elements thus generated to determine target volume setting steps (3-*i* to 3-*j*) respectively corresponding to target volume envelope generating steps (5-*i* to 5-*j*) which respectively generated volume envelope values changed at said time interval for said target volume setting steps (3-*i* to 3-*j*), and respectively outputting said target flag data elements to said target volume setting steps (3-*i* to 3-*j*) in response to said trigger signal outputted in said timer step (4) at said time interval; and said target volume setting steps (3-*i* to 3-*j*) have the steps of respectively setting said volume levels of target sound elements inputted by target sound inputting steps (1-*i* to 1-*j*) in accordance with said target flag data elements outputted in said control step (6, 7).

13. A volume adjusting method as set forth in claim 12, in which said control step (6, 7) includes the steps of:

a plurality of volume envelope flag steps (6-1 to 6-*n*) respectively corresponding to said volume envelope generating steps (5-1 to 5-n) of inputting volume envelope values for respective volume setting steps (3-1 to 3-*n*) respectively generated in said volume envelope generating steps (5-1 to 5-*n*) at said time interval, and selectively generating target flag data elements on the basis of differences of said volume envelope values for target volume setting steps (3-*i* to 3-*j*) at said time interval for said volume envelope values changed at said time interval for said target volume setting steps (3-*i* to 3-*j*) and generating non-target flag data elements for non-target volume setting steps (3-1 to 3-*n*) other than said target volume setting steps (3-*i* to 3-*j*) at said time interval for said volume envelope values unchanged at said time interval for non-target volume setting steps (3-1 to 3-*n*) other than said target volume setting steps (3-*i* to 3-*j*); and flag search step (7) of said searching target flag data elements from among said flag data elements thus generated to determine target volume setting steps (3-*i* to 3-*j*) respectively corresponding to target volume envelope generating steps (5-*i* to 5-*j*) which respectively generated volume envelope values changed at said time interval for said target volume setting steps (3-*i* to 3-*j*), and respectively outputting said target flag data elements to said target volume setting steps (3-*i* to 3-*j*) in response to said trigger signal outputted in said timer step (4) at said time interval.

14. A volume adjusting method as set forth in claim 12, in which said volume setting steps (3-1 to 3-*n*) include inactive volume setting steps (3-*k* to 3*l*) not able to respectively set said volume levels of said sound elements inputted in said sound inputting steps (1-*k* to 1-*l*) in accordance with said flag data elements outputted in said control step (6, 7) and active volume setting steps (3-*m* to 3-*n*) able to respectively set said volume levels of said sound elements inputted in said sound inputting steps (1-*m* to 1-*n*) in accordance with said flag data elements outputted in said control step (6, 7), and which further comprising the steps of:

volume setting number counting step (8) of counting the number of said active volume setting steps (3-*m* to 3-*n*); and timer interval calculating step (9) of calculating said time interval on the basis of the number of said active volume setting steps (3-*m* to 3-*n*) calculated in said volume setting number counting step (8), said timer step (4) has the step of outputting said trigger signal at said time interval calculated in said timer interval calculating step (9).

15. A volume adjusting method as set forth in claim 12 further comprising the steps of:

flag number counting step (10) of counting the number of target volume setting steps (3-*i* to 3-*j*) which said control step (6, 7) has the step of outputting said target flag data elements to; and timer interval calculating step (9) of calculating said time interval on the basis of the number of target volume setting steps (3-*i* to 3-*j*) thus calculated in said flag number counting step (10), said timer step (4) has the step of outputting said trigger signal at said time interval calculated in said timer interval calculating step (9).

16. A volume adjusting method as set forth in claim 12 further comprising the steps of:

volume envelope start trigger steps (11-1 to 11-*n*) respectively corresponding to said volume envelope generating steps (5-1 to 5-*n*) each for inputting a trigger operation command therethrough and outputting a trigger signal to corresponding one of said volume envelope generating steps (5-1 to 5-*n*) in accordance with said trigger operation command, in which one or more of said volume envelope start trigger steps (11-*a* to 11-*b*) are operated to input said trigger operation commands and output trigger signals to corresponding one or more of said volume envelope generating steps (5-*a* to 5-*b*) in accordance with said trigger operation commands, and said one or more of said volume envelope generating steps (5-*a* to 5-*b*) respectively corresponding to one or more of said volume envelope start trigger steps (11-*a* to 11-*b*) have the steps of selectively generating volume envelope values for respective volume setting steps (3-*a* to 3-*b*) in accordance with predetermined envelope forms in response to said trigger signals outputted by one or more of said volume envelope start trigger steps (11-*a* to 11-*b*).

17. A volume adjusting method as set forth in claim 16 further comprising the steps of:

pattern table data managing step (12) of storing volume envelope start trigger pattern table data elements respectively associated with pattern numbers; and pattern number issuing step (13) of issuing a pattern number, in which said pattern table data managing step (12) has the step of respectively outputting volume envelope start trigger pattern table data elements for said volume envelope generating steps (5-1 to 5-*n*) in response to said pattern number issued in said pattern number issuing step (13), and said volume envelope generating steps (5-1 to 5-*n*) respectively corresponding to said volume setting steps (3-1 to 3-*n*) have the steps of selectively generating volume envelope values for respective volume setting steps (3-1 to 3-*n*) in accordance with predetermined envelope forms in response to said volume envelope start trigger pattern table data elements outputted in said pattern table data managing step (12).

18. A volume adjusting method as set forth in claim 12 further comprising the steps of:

volume envelope curve display step (14) of inputting said pattern number issued in said pattern number issuing step (13), said volume envelope start trigger pattern table data elements for said volume envelope generating steps (5-1 to 5-*n*) outputted in said pattern table data managing step (12) in response to said pattern number issued in said pattern number issuing step (13), and said trigger signal outputted in said timer step (4) to respectively calculate volume envelope curves for said volume setting steps (3-1 to 3-*n*) respectively corresponding to said volume envelope generating steps (5-1 to 5-*n*) to be displayed in response to said trigger signal outputted in said timer step (4) at said time interval.

19. A volume adjusting method as set forth in 18 in which said volume envelope curve display step (14) includes the steps of:

volume envelope curve operating step (14-1) of inputting an operating command including a first operating command and a second operating command therethrough, said pattern number issuing step (13) has the step of issuing a pattern number in response to said first operating command inputted in said volume envelope curve operating step (14-1), and said pattern table data managing step (12) has the step of respectively outputting volume envelope start trigger pattern table data elements for said volume envelope generating steps (5-1 to 5-*n*) in response to said second operating command inputted in said volume envelope curve operating step (14-1).

20. A volume adjusting method as set forth in claim 12 further comprising the steps of:

flag overwriting step (15) of overwriting said flag data elements for specified volume setting steps (3-*o* to 3-*p*) generated in said control step (6, 7) with specified flag data elements so that control step (6, 7) has the step of respectively outputting said specified flag data elements for said specified volume setting steps (3-*o* to 3-*p*) to said specified volume setting steps (3-*o* to 3-*p*), in which said specified volume setting steps (3-*o* to 3-*p*) have the steps of respectively setting said volume levels of said sound elements inputted in said sound inputting steps (1-*o* to 1-*p*) in accordance with said specified flag data elements outputted in said control step (6, 7).

21. A volume adjusting method as set forth in claim 20 in which said specified flag data elements are mute flag data elements, and said specified volume setting steps (3-*o* to 3-*p*) have the steps of respectively setting said volume levels of said sound elements inputted in said sound inputting steps (1-*o* to 1-*p*) to mute state in accordance with said mute flag data elements outputted in said control step (6, 7).

22. A volume adjusting method as set forth in claim 12 further comprising the steps of:

volume envelope data storage step (16) of storing volume envelope data elements forming part of said flag data elements, in which said control step (6, 7) has the steps of inputting said volume envelope data elements stored in said volume envelope data storage step (16), judging if said volume envelope data elements thus inputted are equivalent to said flag data elements at said time interval, and respectively outputting said volume envelope data elements thus inputted to volume setting steps (3-1 to 3-*n*) if it is judged that said volume envelope data elements thus inputted are equivalent to said flag data elements at said time interval and, otherwise, transmitting a volume envelope start request to said volume envelope generating steps (5-1 to 5-*n*) to selectively generate volume envelope values for respective volume setting steps (3-1 to 3-*n*) on the basis of said volume envelope data elements, in which said volume envelope generating steps (5-1 to 5-*n*) respectively corresponding to said volume setting steps (3-1 to 3-*n*) have the steps of selectively generating volume envelope values for respective volume setting steps (3-1 to 3-*n*) in accordance with predetermined envelope forms on the basis of said volume envelope start request transmitted in said control step (6, 7), said control step (6, 7) have the steps of inputting volume envelope values for respective volume setting steps (3-1 to 3-*n*) respectively generated in said volume envelope generating steps (5-1 to 5-*n*) on the basis of said volume envelope start request transmitted in said control step (6, 7), selectively generating target flag data elements on the basis of differences of said volume envelope values for target volume setting steps (3-*i* to 3-*j*) at said time interval for said volume envelope values changed at said time interval for said target volume setting steps (3-*i* to 3-*j*) and generating non-target flag data elements for non-target volume setting steps (3-1 to 3-*n*) other than said target volume setting steps (3-*i* to 3-*j*) at said time interval for said volume envelope values unchanged at said time interval for non-target volume setting steps (3-1 to 3-*n*) other than said target volume setting steps (3-*i* to 3-*j*), searching said target flag data elements from among said flag data elements thus generated to determine target volume setting steps (3-*i* to 3-*j*) respectively corresponding to target volume envelope generating steps (5-*i* to 5-*j*) which respectively generated volume envelope values changed at said time interval for said target volume setting steps (3-*i* to 3-*j*), and respectively outputting said target flag data elements to said target volume setting steps (3-*i* to 3-*j*) in response to said trigger signal outputted in said timer step (4) at said time interval; and said target volume setting steps (3-*i* to 3-*j*) have the steps of respectively setting said volume levels of said target sound elements inputted in said target sound inputting steps (1-*i* to 1-*j*) in accordance with said target flag data elements outputted in said control step (6, 7).

23. A computer program product comprising a computer usable storage medium having computer readable code embodied therein for adjusting volumes recoded on a record medium, wherein said computer readable code comprising:

a plurality of program product codes (1—1 to 1-*n*) for respectively inputting sound elements;

a plurality of program product codes (3-1 to 3-*n*) respectively connected with said program product codes (1—1 to 1-*n*) to respectively set volume levels of said sound elements inputted by said program product codes (1—1 to 1-*n*); and a plurality of program product codes (2-1 to 2-*n*) for respectively outputting said sound elements at said volume levels respectively set by said program product codes (3-1 to 3-*n*);

whereby said computer program product further comprises:

program product code (4) for outputting a trigger signal at a time interval;

a plurality of program product codes (5-1 to 5-*n*) respectively corresponding to said program product codes (3-1 to 3-*n*) for selectively generating volume envelope values for respective program product codes (3-1 to 3-*n*) in accordance with predetermined envelope forms in response to said trigger signal outputted by said program product code (4) at said time interval; and program product code (6, 7) for inputting volume envelope values for respective program product codes (3-1 to 3-*n*) respectively generated by said program product codes (5-1 to 5-*n*) in response to said trigger signal outputted by said program product code (4) at said time interval, selectively generating target flag data elements on the basis of differences of said volume envelope values for target program product codes (3-*i* to 3-*j*) at said time interval for said volume envelope values changed at said time interval for said target program product codes (3-*i* to 3-*j*) and generating non-target flag data elements for non-target program product codes (3-1 to 3-*n*) other than said target program product codes (3-*i* to 3-*j*) at said time interval for said volume envelope values unchanged at said time interval for non-target program product codes (3-1 to 3-*n*) other than said target program product codes (3-*i* to 3-*j*), searching said target flag data elements from among said flag data elements thus generated to determine target program product codes (3-*i* to 3-*j*) respectively corresponding to target program product codes (5-*i* to 5-*j*) which respectively generated volume envelope values changed at said time interval for said target program product codes (3-*i* to 3-*j*), and respectively outputting said target flag data elements to said target program product codes (3-*i* to 3-*j*) in response to said trigger signal outputted by said program product code (4) at said time interval; and said target program product codes (3-*i* to 3-*j*) have computer product code for respectively setting said volume levels of target sound elements inputted by target program product codes (1-*i* to 1-*j*) in accordance with said target flag data elements outputted by said program product code (6, 7).

24. A computer program product as set forth in claim 23, in which said program product code (6, 7) includes:

a plurality of program product codes (6-1 to 6-*n*) respectively corresponding to said program product codes (5-1 to 5-*n*) for inputting volume envelope values for respective program product codes (3-1 to 3-*n*) respectively generated by said program product codes (5-1 to 5-*n*) at said time interval, and selectively generating target flag data elements on the basis of differences of said volume envelope values for target program product codes (3-*i* to 3-*j*) at said time interval for said volume envelope values changed at said time interval for said target program product codes (3-*i* to 3-*j*) and generating non-target flag data elements for non-target program product codes (3-1 to 3-*n*) other than said target program product codes (3-*i* to 3-*j*) at said time interval for said volume envelope values unchanged at said time interval for non-target program product codes (3-1 to 3-*n*) other than said target program product codes (3-*i* to 3-*j*); and program product code (7) for said searching target flag data elements from among said flag data elements thus generated to determine target program product codes (3-*i* to 3-*j*) respectively corresponding to target program product codes (5-*i* to 5-*j*) which respectively generated volume envelope values changed at said time interval for said target program product codes (3-*i* to 3-*j*), and respectively outputting said target flag data elements to said target program product codes (3-*i* to 3-*j*) in response to said trigger signal outputted by said program product code (4) at said time interval.

25. A computer program product as set forth in claim 23, in which said program product codes (3-1 to 3-*n*) include inactive program product codes (3-*k* to 3*l* ) not able to respectively set said volume levels of said sound elements inputted by said program product codes (1-*k* to 1-*l*) in accordance with said flag data elements outputted by said program product code (6, 7) and program product codes (3-*m* to 3-*n*) able to respectively set said volume levels of said sound elements inputted by said program product codes (1-*m* to 1-*n*) in accordance with said flag data elements outputted by said program product code (6, 7), and which further comprising:

program product code (8) for counting the number of said program product codes (3-*m* to 3-*n*); and program product code (9) for calculating said time interval on the basis of the number of said program product codes (3-*m* to 3-*n*) calculated by said program product code (8), said program product code (4) has computer product code for outputting said trigger signal at said time interval calculated by said program product code (9).

26. A computer program product as set forth in claim 23 further comprising:

program product code (10) for counting the number of target program product codes (3-*i* to 3-*j*) which said program product code (6, 7) has computer product code for outputting said target flag data elements to; and program product code (9) for calculating said time interval on the basis of the number of target program product codes (3-*i* to 3-*j*) thus calculated by said program product code (10), said program product code (4) has computer product code for outputting said trigger signal at said time interval calculated by said program product code (9).

27. A computer program product as set forth in claim 23 further comprising:

program product codes (11-1 to 11-*n*) respectively corresponding to said program product codes (5-1 to 5-*n*) each for inputting a trigger operation command therethrough and outputting a trigger signal to corresponding one of said program product codes (5-1 to 5-*n*) in accordance with said trigger operation command, in which one or more of said program product codes (11-*a* to 11-*b*) are operated to input said trigger operation commands and output trigger signals to corresponding one or more of said program product codes (5-*a* to 5-*b*) in accordance with said trigger operation commands, and said one or more of said program product codes (5-*a* to 5-*b*) respectively corresponding to one or more of said program product codes (11-*a* to 11-*b*) have computer product code for selectively generating volume envelope values for respective program product codes (3-*a* to 3-*b*) in accordance with predetermined envelope forms in response to said trigger signals outputted by one or more of said program product codes (11-*a* to 11-*b*).

28. A computer program product as set forth in claim 27 further comprising:

program product code (12) for storing volume envelope start trigger pattern table data elements respectively associated with pattern numbers; and program product code (13) for issuing a pattern number, in which said program product code (12) has computer product code for respectively outputting volume envelope start trigger pattern table data elements for said program product codes (5-1 to 5-*n*) in response to said pattern number issued by said program product code (13), and said program product codes (5-1 to 5-*n*) respectively corresponding to said program product codes (3-1 to 3-*n*) have computer product code for selectively generating volume envelope values for respective program product codes (3-1 to 3-*n*) in accordance with predetermined envelope forms in response to said volume envelope start trigger pattern table data elements outputted by said program product code (12).

29. A computer program product as set forth in claim 23 further comprising:

program product code (14) for inputting said pattern number issued by said program product code (13), said volume envelope start trigger pattern table data elements for said program product codes (5-1 to 5-*n*) outputted by said program product code (12) in response to said pattern number issued by said program product code (13), and said trigger signal outputted by said program product code (4) to respectively calculate volume envelope curves for said program product codes (3-1 to 3-*n*) respectively corresponding to said program product codes (5-1 to 5-*n*) to be displayed in response to said trigger signal outputted by said program product code (4) at said time interval.

30. A computer program product as set forth in 29 in which said program product code (14) includes:

program product code (14-1) for inputting an operating command including a first operating command and a second operating command therethrough, said program product code (13) has computer product code for issuing a pattern number in response to said first operating command inputted by said program product code (14-1), and said program product code (12) has computer product code for respectively outputting volume envelope start trigger pattern table data elements for said program product codes (5-1 to 5-*n*) in response to said second operating command inputted by said program product code (14-1).

31. A computer program product as set forth in claim 23 further comprising:

program product code (15) for overwriting said flag data elements for specified program product codes (3-*o* to 3-*p*) generated by said program product code (6, 7) with specified flag data elements so that program product code (6, 7) has computer product code for respectively outputting said specified flag data elements for said specified program product codes (3-*o* to 3-*p*) to said specified program product codes (3-*o* to 3-*p*), in which said specified program product codes (3-*o* to 3-*p*) have computer product code for respectively setting said volume levels of said sound elements inputted by said program product codes (1-*o* to 1-*p*) in accordance with said specified flag data elements outputted by said program product code (6, 7).

32. A computer program product as set forth in claim 31 in which said specified flag data elements are mute flag data elements, and said specified program product codes (3-*o* to 3-*p*) have computer product code for respectively setting said volume levels of said sound elements inputted by said program product codes (1-*o* to 1-*p*) to mute state in accordance with said mute flag data elements outputted by said program product code (6, 7).

33. A computer program product as set forth in claim 23 further comprising:

computer program code (16) for storing volume envelope data elements forming part of said flag data elements, in which said program product code (6, 7) has computer product code for inputting said volume envelope data elements stored in said computer program code (16), judging if said volume envelope data elements thus inputted are equivalent to said flag data elements at said time interval, and respectively outputting said volume envelope data elements thus inputted to program product codes (3-1 to 3-*n*) if it is judged that said volume envelope data elements thus inputted are equivalent to said flag data elements at said time interval and, otherwise, transmitting a volume envelope start request to said program product codes (5-1 to 5-*n*) to selectively generate volume envelope values for respective program product codes (3-1 to 3-*n*) on the basis of said volume envelope data elements, in which said program product codes (5-1 to 5-*n*) respectively corresponding to said program product codes (3-1 to 3-*n*) have computer product code for selectively generating volume envelope values for respective program product codes (3-1 to 3-*n*) in accordance with predetermined envelope forms on the basis of said volume envelope start request transmitted by said program product code (6, 7), said program product code (6, 7) has computer product code for inputting volume envelope values for respective program product codes (3-1 to 3-*n*) respectively generated by said program product codes (5-1 to 5-*n*)

on the basis of said volume envelope start request transmitted by said program product code (6, 7), selectively generating target flag data elements on the basis of differences of said volume envelope values for target program product codes (3-*i* to 3-*j*) at said time interval for said volume envelope values changed at said time interval for said target program product codes (3-*i* to 3-*j*) and generating non-target flag data elements for non-target program product codes (3-1 to 3-*n*) other than said target program product codes (3-*i* to 3-*j*) at said time interval for said volume envelope values unchanged at said time interval for non-target program product codes (3-1 to 3-*n*) other than said target program product codes (3-*i* to 3-*j*), searching said target flag data elements from among said flag data elements thus generated to determine target program product codes (3-*i* to 3-*j*) respectively corresponding to target program product codes (5-*i* to 5-*j*) which respectively generated volume envelope values changed at said time interval for said target program product codes (3-*i* to 3-*j*), and respectively outputting said target flag data elements to said target program product codes (3-*i* to 3-*j*) in response to said trigger signal outputted by said program product code (4) at said time interval; and said target program product codes (3-*i* to 3-*j*) have computer product code for respectively setting said volume levels of said target sound elements inputted by said target program product codes (1-*i* to 1-*j*) in accordance with said target flag data elements outputted by said program product code (6, 7).

* * * * *